(12) United States Patent
Kume et al.

(10) Patent No.: US 7,426,227 B2
(45) Date of Patent: Sep. 16, 2008

(54) SEMICONDUCTOR LASER DEVICE, OPTICAL DISK APPARATUS AND OPTICAL INTEGRATED UNIT

(75) Inventors: Masahiro Kume, Shiga (JP); Isao Kidoguchi, Hyogo (JP); Yuzaburo Ban, Osaka (JP); Ryoko Miyanaga, Nara (JP); Masakatsu Suzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 254 days.

(21) Appl. No.: 11/447,951

(22) Filed: Jun. 7, 2006

(65) Prior Publication Data
US 2006/0239311 A1    Oct. 26, 2006

Related U.S. Application Data

(62) Division of application No. 10/852,132, filed on May 25, 2004, now Pat. No. 7,092,423, which is a division of application No. 09/504,782, filed on Feb. 15, 2000, now Pat. No. 7,212,556.

(30) Foreign Application Priority Data

Feb. 17, 1999 (JP) ............... 11-038307
Mar. 11, 1999 (JP) ............... 11-064464
Jun. 23, 1999 (JP) ............... 11-176445

(51) Int. Cl.
H01S 5/00 (2006.01)
(52) U.S. Cl. ............ 372/43.01; 372/44.01; 372/29.022; 372/29.02
(58) Field of Classification Search ............... 372/29.02, 372/29.022, 43.01, 44.01; 369/120, 121
See application file for complete search history.

(56) References Cited

U.S. PATENT DOCUMENTS 4,718,052 A    1/1988    Kondo et al.
5,528,407 A    6/1996    Nakata et al.

(Continued)

FOREIGN PATENT DOCUMENTS

JP    49-104590    10/1974

(Continued)

OTHER PUBLICATIONS

Notice of Reasons of Rejection (Dated Apr. 8, 2003).

(Continued)

Primary Examiner—Minsun Harvey
Assistant Examiner—Delma R Fordé
(74) Attorney, Agent, or Firm—Nixon Peabody LLP; Jeffrey L. Costellia

(57) ABSTRACT

A semiconductor laser device includes: a first cladding layer, which is made of a nitride semiconductor of a first conductivity type and is formed over a substrate; an active layer, which is made of another nitride semiconductor and is formed over the first cladding layer; and a second cladding layer, which is made of still another nitride semiconductor of a second conductivity type and is formed over the active layer. A spontaneous-emission-absorbing layer, which is made of yet another nitride semiconductor of the first conductivity type and has such an energy gap as absorbing spontaneous emission that has been radiated from the active layer, is formed between the substrate and the first cladding layer.

4 Claims, 12 Drawing Sheets

U.S. PATENT DOCUMENTS

| | | | |
|---|---|---|---|
| 5,638,391 A | 6/1997 | Shima et al. | |
| 5,777,350 A | 7/1998 | Nakamura et al. | |
| 5,787,215 A | 7/1998 | Kuhara et al. | |
| 5,838,029 A | 11/1998 | Shakuda | |
| 5,981,977 A | 11/1999 | Furukawa et al. | |
| 6,258,617 B1 | 7/2001 | Nitta et al. | |
| 6,455,337 B1 | 9/2002 | Sverdlov | |
| 6,474,531 B2 | 11/2002 | Ozawa | |
| 6,479,325 B2 | 11/2002 | Ozawa | |
| 6,720,581 B2 | 4/2004 | Ozawa | |
| 6,761,303 B2 | 7/2004 | Ozawa | |
| 6,835,963 B2 | 12/2004 | Hatakoshi et al. | |
| 6,858,877 B2 | 2/2005 | Kawaguchi et al. | |
| 7,092,423 B2* | 8/2006 | Kume et al. | 372/45.013 |
| 7,212,556 B1* | 5/2007 | Kume et al. | 372/43.01 |
| 2002/0050600 A1* | 5/2002 | Hayakawa | 257/89 |
| 2003/0205736 A1 | 11/2003 | Kozaki | |
| 2004/0056242 A1* | 3/2004 | Ohno et al. | 257/13 |
| 2004/0101986 A1 | 5/2004 | Kozaki et al. | |
| 2004/0233950 A1 | 11/2004 | Furukawa et al. | |
| 2005/0041714 A1* | 2/2005 | Kim | 372/50 |
| 2005/0269584 A1* | 12/2005 | Hasegawa et al. | 257/94 |
| 2005/0286583 A1* | 12/2005 | Guenter et al. | 372/50.1 |
| 2005/0286593 A1* | 12/2005 | Guenter | 372/50.21 |

FOREIGN PATENT DOCUMENTS

| | | |
|---|---|---|
| JP | 60-016489 | 1/1985 |
| JP | 62-282474 | 12/1987 |
| JP | 63-034991 | 2/1988 |
| JP | 63-198390 | 8/1988 |
| JP | 02-214182 | 8/1990 |
| JP | 06-152046 | 5/1994 |
| JP | 06-140724 | 5/1994 |
| JP | 06-152046 | 5/1994 |
| JP | 07-202320 | 8/1995 |
| JP | 07-321406 | 12/1995 |
| JP | 07-335969 | 12/1995 |
| JP | 07-335973 | 12/1995 |
| JP | 09-083067 | 3/1997 |
| JP | 09-205253 | 8/1997 |
| JP | 09-232685 | 9/1997 |
| JP | 11-068256 | 3/1999 |
| JP | 11-251685 | 9/1999 |
| KR | 2002-000898 | 1/2002 |

OTHER PUBLICATIONS

Notice of Reasons of Rejection, Patent Application No. 2000-021277, Mailing Date: Jul. 23, 2002 with English translation.

* cited by examiner

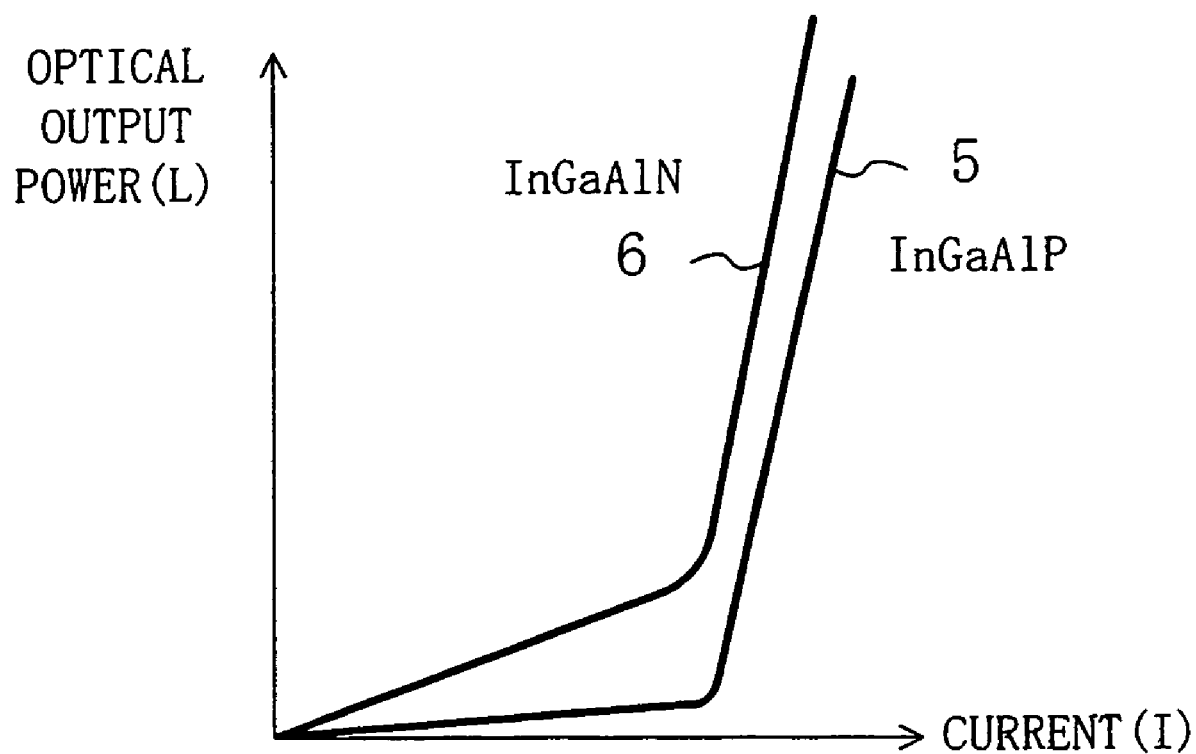

SEMICONDUCTOR LASER DEVICE, OPTICAL DISK APPARATUS AND OPTICAL INTEGRATED UNIT

BACKGROUND OF THE INVENTION

The present invention generally relates to a semiconductor laser device for emitting blue laser radiation, which is applicable as a laser light source to an optical information storage medium such as an optical disk. More particularly, the present invention relates to a semiconductor laser device that can prevent spontaneous emission from leaking out of the device and also relates to an optical disk apparatus and optical integrated unit using such a device.

A nitride semiconductor laser device, which is made of nitride semiconductors containing Group III elements like aluminum (Al), gallium (Ga) and/or indium (In), emits blue laser radiation in a wavelength range from 400 to 500 nm when its active layer is made of an InGaN compound. Currently, a red-light-emitting semiconductor laser device, which emits laser radiation in the red part of the spectrum with a wavelength of 650 nm, is applied to recording or reproducing information from a DVD. However, if such a blue-light-emitting semiconductor laser device is actually applied to a DVD, then the storage capacity of the DVD can be increased threefold or more. Specifically, the storage capacity of a disk per side with a diameter of 12 cm can be raised to as high as 15 gigabytes or more. The implementation of such blue-light-emitting semiconductor laser devices is in high demand. This is because a high definition (HD) video signal can be reproduced from a disk with a storage capacity of 15 gigabytes for as long as two hours or more according to the MPEG-2 standard, an international standard of moving picture compression. A nitride semiconductor laser device, which can oscillate successfully at such a short wavelength (i.e., in the range from about 400 to about 450 nm), includes an InGaN active layer and AlGaN cladding layers.

The InGaN active layer and AlGaN cladding layers are usually formed by growing InGaN and AlGaN crystals over a substrate. Accordingly, a GaN substrate, which has the same crystal structure as InGaN and AlGaN and a lattice constant almost equal to those of InGaN and AlGaN, is best suited to growing these layers with minimized crystal imperfections. In the current state of the art, however, a GaN substrate with a size of 10 mm or more on each side is not available. Thus, a sapphire substrate (made of single crystalline $Al_2O_3$) is generally used as a substitute substrate. Although sapphire has a lattice constant that is different from that of GaN by as much as 14%, sapphire is still appropriate for the growth of nitride semiconductor crystals because sapphire has the same crystal structure as GaN and is stable enough even at an elevated temperature of 1000° C. or more.

In semiconductor laser devices in general, not just in nitride ones, when current exceeding the threshold value thereof is injected into the p- and n-side electrodes thereof, electrons and holes, which have been created from the injected current, are recombined to emit radiation, which is strongly confined in the active layer. As a result, the current is amplified, continuous oscillation occurs and the radiation is emitted as laser radiation through the emissive end facet of the active layer.

When the active layer of a nitride semiconductor laser device is made of InGaN mixed crystals with an In mole fraction of 15%, bluish purple laser radiation is obtained at an oscillation wavelength of 410 nm. In that case, a pair of cladding layers with a refractive index smaller than that of the active layer should be provided over and under the active layer, and the energy gap between the active layer and the cladding layers should be 0.4 eV or more. These cladding layers are usually made of AlGaN mixed crystals with an Al mole fraction of 7%.

Considering its principle of operation, however, the blue laser radiation emitted from the prior art nitride semiconductor laser device is harder to detect than the red laser radiation, and therefore the signal-to-noise ratio (SNR) obtained at a light-receiving device such as a photodetector is usually low. Thus, compared to the red-light-emitting semi-conductor laser device, it is much more necessary for the nitride semiconductor laser device of the short-wave-emission type to reduce the noise produced from the device.

SUMMARY OF THE INVENTION

An object of the present invention is reducing noise, e.g., optical noise, in particular, that has been produced from a nitride semiconductor laser device of the short-wave-emission type.

For the purpose of implementing a short-wave-emitting laser device, the present inventors looked into various imaginable sources of noise that is produced from a blue-light-emitting laser device. As a result, we spotted the following optical factor as a root of the problem.

Specifically, on and after current is applied to a semiconductor laser device, spontaneous emission is created in the light-emitting region of an active layer. And once the current applied has exceeded a predetermined value, the spontaneous emission is amplified in the longitudinal direction of the resonant cavity, and then oscillation phenomenon starts to be observed. As a result, coherent laser radiation is emitted from the emissive end facet of the active layer. The current at the predetermined value is called "oscillation threshold current". After the applied current has reached the threshold value and before the laser oscillation starts to be observed, only the spontaneous emission goes on increasing.

The spontaneous emission is not coherent laser radiation. Accordingly, if the spontaneous emission is mixed into the laser radiation, then various adverse effects are caused. For example, where a laser device is used as an optical pickup for an optical disk, the spontaneous emission component constitutes noise for the laser radiation, thus decreasing the SNR when information is read out from the optical disk. Also, the spontaneous emission is emitted not just from the emissive end facet of a laser chip. Accordingly, in an optical integrated unit in which a laser chip is integrated together with a photodetector or an electronic circuit, the spontaneous emission becomes biasing light for the photodetector to adversely affect the detection operation of the photodetector.

To achieve the foregoing object, the present invention provides a spontaneous-emission-absorbing layer inside or on the surface of a laser chip to minimize the spontaneous emission leaking out of the chip. Also, the present invention provides a spontaneous emission protective film showing a high reflectance against the spontaneous emission on the upper or side faces of the chip such that the spontaneous emission does not leak out. In addition, the present invention provides means for blocking the spontaneous emission between the laser chip and a monitoring photodetector to prevent the spontaneous emission from being mixed into monitoring light for use in automatic power control.

Hereinafter, specific means of the present invention for solving the problem will be enumerated.

A first exemplary semiconductor laser device according to the present invention includes: a first cladding layer, which is made of a nitride semiconductor of a first conductivity type and is formed over a substrate; an active layer, which is made of another nitride semiconductor and is formed over the first cladding layer; and a second cladding layer, which is made of still another nitride semiconductor of a second conductivity type and is formed over the active layer. A spontaneous-emission-absorbing layer, which is made of yet another nitride semiconductor of the first conductivity type and absorbs spontaneous emission that has been radiated from the active layer, is formed between the substrate and the first cladding layer.

In the first semiconductor laser device, the spontaneous emission that has been radiated from the active layer toward the substrate is absorbed into the spontaneous-emission-absorbing layer. That is to say, the spontaneous emission involved with the laser oscillation does not leak out of the device. Accordingly, optical noise, which adversely affects optical elements surrounding the device, can be greatly reduced.

In one embodiment of the present invention, the spontaneous-emission-absorbing layer may contain indium and be formed in contact with the first cladding layer. In such an embodiment, since the spontaneous-emission-absorbing layer contains indium, the energy gap of the spontaneous-emission-absorbing layer can be smaller than the energy of the spontaneous emission radiated from the nitride semiconductors. As a result, the spontaneous emission can be absorbed just as intended.

In an alternate embodiment, the spontaneous-emission-absorbing layer may contain indium and be formed in contact with the substrate. In such an embodiment, the spontaneous-emission-absorbing layer can also function as a buffer layer to be formed on the upper surface of the substrate for improving the crystallinity of nitride semiconductor layers growing thereon.

A second exemplary semiconductor laser device according to the present invention includes: a first cladding layer, which is made of a nitride semiconductor of a first conductivity type and is formed over a substrate; an active layer, which is made of another nitride semiconductor and is formed over the first cladding layer; a second cladding layer, which is made of still another nitride semiconductor of a second conductivity type and is formed over the active layer; and an electrode formed over the second cladding layer. A spontaneous-emission-absorbing layer, which is made of yet another nitride semiconductor of the second conductivity type and absorbs spontaneous emission that has been radiated from the active layer, is formed between the second cladding layer and the electrode.

In the second semiconductor laser device, the spontaneous emission that has been radiated from the active layer toward the electrode located over the second cladding layer is absorbed into the spontaneous-emission-absorbing layer. Accordingly, optical noise, which adversely affects optical elements surrounding the device, can be greatly reduced.

In one embodiment of the present invention, the spontaneous-emission-absorbing layer may contain indium and be formed in contact with the second cladding layer.

In an alternate embodiment, the spontaneous-emission-absorbing layer may contain indium and be formed in contact with the electrode. In such an embodiment, the spontaneous-emission-absorbing layer can also function as a contact layer to be formed over the second cladding layer in ohmic contact with the electrode.

A third exemplary semiconductor laser device according to the present invention includes a laser diode body. The laser diode body includes: a first cladding layer, which is made of a nitride semiconductor of a first conductivity type and is formed over a substrate; an active layer, which is made of another nitride semiconductor and is formed over the first cladding layer; and a second cladding layer, which is made of still another nitride semiconductor of a second conductivity type and is formed over the active layer. A spontaneous emission protective film for absorbing or reflecting spontaneous emission that has been radiated from the active layer is formed on a surface of the substrate, which surface is opposite to another surface thereof over which the active layer is located.

In the third semiconductor laser device, the spontaneous emission protective film can prevent the spontaneous emission, which has been emitted from the active layer toward the substrate, from leaking out.

A fourth exemplary semiconductor laser device according to the present invention includes a laser diode body. The laser diode body includes: a first cladding layer, which is made of a nitride semiconductor of a first conductivity type and is formed over a substrate; an active layer, which is made of another nitride semiconductor and is formed over the first cladding layer; and a second cladding layer, which is made of still another nitride semiconductor of a second conductivity type and is formed over the active layer. Spontaneous emission protective films for absorbing or reflecting spontaneous emission that has been radiated from the active layer are formed on an emissive end facet of the laser diode body, except for a portion of the active layer from which laser radiation is emitted, and on a reflective end facet of the laser diode body, which faces the emissive end facet.

In the fourth semiconductor laser device, the spontaneous emission protective films can prevent the spontaneous emission, which has been radiated from the active layer toward the electrode located over the second cladding layer, from leaking out. In this specification, the laser diode (chip) body refers to a stack of multiple semiconductor layers formed on a substrate, which includes a resonant cavity.

A fifth exemplary semiconductor laser device according to the present invention includes a laser diode body. The laser diode body includes: a first cladding layer, which is made of a nitride semiconductor of a first conductivity type and is formed over a substrate; an active layer, which is made of another nitride semiconductor and is formed over the first cladding layer; and a second cladding layer, which is made of still another nitride semiconductor of a second conductivity type and is formed over the active layer. Spontaneous emission protective films for absorbing or reflecting spontaneous emission that has been radiated from the active layer are formed on side faces of the laser diode body, which are parallel to a direction in which the laser radiation is emitted.

In the fifth semiconductor laser device, the spontaneous emission protective films can prevent the spontaneous emission, which has been radiated from the active layer toward the side faces of the laser diode body, from leaking out.

In the third through fifth semiconductor laser devices, the spontaneous emission protective film is preferably made of silicon or a metal containing gold. Since the energy gap of silicon is smaller than the energy of the spontaneous emission radiated from the nitride semiconductors, the spontaneous emission can be absorbed just as intended. In addition, gold is a highly stable material and can reflect the spontaneous emission that has been radiated from the nitride semiconductors at a high reflectance. Furthermore, gold and silicon are compatible with a semiconductor device fabrication process very easily.

A sixth exemplary semiconductor laser device according to the present invention includes: a first cladding layer, which is made of a nitride semiconductor of a first conductivity type and is formed over a substrate; an active layer, which is made of another nitride semiconductor and is formed over the first cladding layer; a second cladding layer, which is made of still another nitride semiconductor of a second conductivity type and is formed over the active layer; and an electrode, which is formed over the second cladding layer and injects striped current into the active layer. A recess is formed in the active layer beside and along a region of the active layer to which the striped current is injected. The recess is filled in with a spontaneous-emission-absorbing member for absorbing spontaneous emission that has been radiated from the active layer.

In the sixth semiconductor laser device, the spontaneous-emission-absorbing member that fills the recess provided along the current injection area prevents the spontaneous emission, which has been radiated from the active layer toward the side faces of the laser diode body, from leaking out.

A seventh exemplary semiconductor laser device according to the present invention includes a laser diode body. The laser diode body includes: a first cladding layer, which is made of a nitride semiconductor of a first conductivity type and is formed over a substrate an active layer, which is made of another nitride semiconductor and is formed over the first cladding layer; and a second cladding layer, which is made of still another nitride semiconductor of a second conductivity type and is formed over the active layer. A spontaneous emission-protective member for absorbing or reflecting spontaneous emission that has been radiated from the active layer is formed on or over a surface of the substrate, which is opposite to another surface thereof over which the active layer is located, and another spontaneous emission protective member is formed to be spaced apart from at least one side face of the laser diode body.

In the seventh semiconductor laser device, the spontaneous emission protective members prevent the spontaneous emission, which has been radiated from the active layer toward the substrate and/or the side faces of the laser diode body, from leaking out.

An eighth exemplary semiconductor laser device according to the present invention includes: a semiconductor laser chip; a photoelectric transducer for receiving laser radiation that has been emitted from the semiconductor laser chip and detecting a value of optical output power of the semiconductor laser chip; and means for blocking at least part of spontaneous emission that has been radiated from the semiconductor laser chip. The blocking means is provided between a portion of the semiconductor laser chip from which the laser radiation is emitted and a portion of the photoelectric transducer at which the laser radiation is received.

In the eighth semiconductor laser device, it is possible to reduce the quantity of the spontaneous emission that enters the photoelectric transducer for monitoring the optical output power of the semiconductor laser chip. Thus, automatic power control can be carried out just as intended.

In one embodiment of the present invention, the blocking means is preferably provided such that the spontaneous emission attenuates at a ratio higher than the laser radiation while passing through the blocking means.

In another embodiment of the present invention, the blocking means may be a light-blocking plate with an opening, through which an optical axis of the laser radiation passes.

In still another embodiment, the semiconductor laser chip may include a substrate made of a material transmitting the laser radiation.

In this particular embodiment, the semiconductor laser chip is preferably made of a nitride semiconductor, and the substrate is preferably made of sapphire, silicon carbide or gallium nitride.

An optical disk apparatus according to the present invention includes: one of the first through eighth semiconductor laser devices of the present invention; a condensing optical system for condensing laser radiation that has been emitted from the semiconductor laser device on a storage medium on which data has been recorded; and a photodetector for detecting the laser radiation that has been reflected from the storage medium.

An optical integrated unit according to the present invention includes, on a support member made of a semiconductor, one of the first through eighth semiconductor laser devices of the present invention and a photodetector for detecting reflected part of laser radiation that has been emitted from the semiconductor laser device.

BRIEF DESCRIPTION OF THE DRAWINGS

FIG. 17 is a graph illustrating, in comparison, respective I-L characteristics of prior art short- and long-wave-oscillating semiconductor laser devices.

DESCRIPTION OF THE PREFERRED EMBODIMENTS

Embodiment 1

Hereinafter, a first embodiment of the present invention will be described with reference to FIG. 1.

Figure 1:
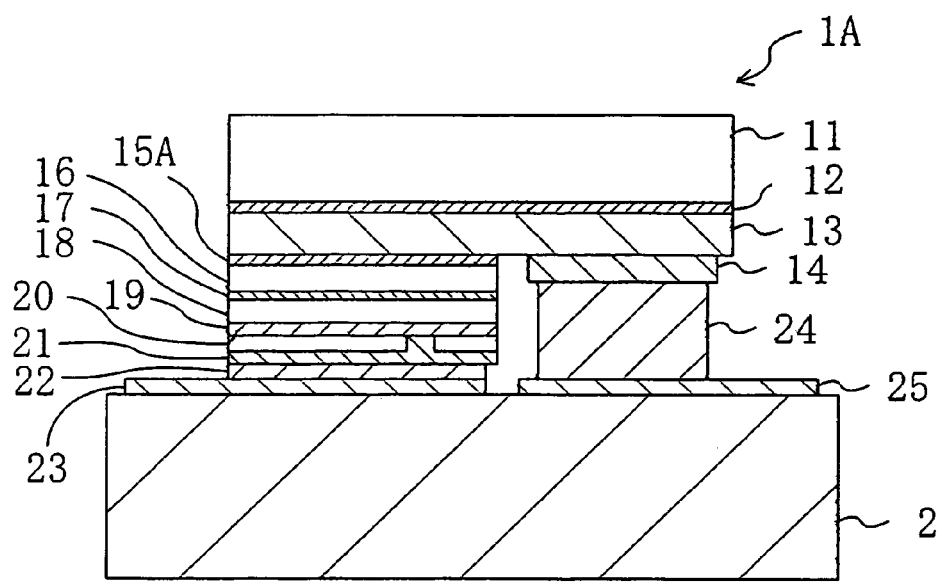
FIG. 1 is a cross-sectional view illustrating a structure of a nitride semiconductor laser device according to a first embodiment of the present invention.

FIG. 1 illustrates a cross-sectional structure of a nitride semiconductor laser device 1A according to the first embodiment. As shown in FIG. 1, the nitride semiconductor laser device 1A is mounted facedown over a submount 2 such that the circuitry side of the device 1A faces the principal surface of the submount 2, which is made of silicon carbide (SiC) or diamond with insulation properties. In this specification, the "nitride semiconductor laser device" refers to a semiconductor laser device made of compound semiconductors represented by a general formula $Al_xGa_yIn_zN$, where $0 \leq x \leq 1$, $0 \leq y \leq 1$, $0 \leq z \leq 1$ and $x+y+z=1$).

In the nitride semiconductor laser device 1A, a buffer layer 12 of GaN or AlN is formed on the principal surface of a sapphire substrate 11, which faces the submount 2 (i.e., its circuitry side). The buffer layer 12 is provided to buffer a misfit of lattice constants between sapphire and GaN crystals and thereby obtain semiconductor layers with reduced crystal imperfections. On the buffer layer 12, a contact layer 13 of n-type GaN doped with Si is formed. On the lower surface of the n-type contact layer 13, an active region, on which a double heterojunction (DH) laser structure will be formed, and an n-type electrode region, on which an n-side electrode will be formed, are defined. As shown in FIG. 1, an n-side electrode 14 is formed by alternately stacking Ti and Al layers or Mo, Pt and Au layers on the n-side electrode region.

On the active region in the lower surface of the n-type contact layer 13, n-type $In_xGa_{1-x}N$ (where $0<x<1$) spontaneous-emission-absorbing layer 15A, n-type AlGaN cladding layer 16, $In_yGa_{1-y}N$ (where $0<y<1$) active layer 17, p-type AlGaN cladding layer 18, p-type GaN contact layer 19 and insulating film 20 of silicon dioxide with striped openings are stacked in this order. The spontaneous-emission-absorbing layer 15A has an energy gap, which is small enough to absorb the spontaneous emission that has been radiated from the active layer 17. The n-type cladding layer 16 confines not only the radiation produced in the active layer 17 but also electrons within the active layer 17, while the p-type cladding layer 18 confines not only the radiation produced in the active layer 17 but also holes within the active layer 17. As a result, the electrons and holes confined in the active layer 17 are recombined together to create recombined radiation. The p-type contact layer 19 makes ohmic contact with a p-side electrode 21. In the illustrated embodiment, the In mole fraction x in the spontaneous-emission-absorbing layer 15A is equal to or larger than the In mole fraction y in the active layer 17.

Supposing the In mole fraction y in well layers of the active layer 17 to be 15%, the laser radiation emitted oscillates at a wavelength of 410 nm. Accordingly, if the In mole fraction x in the spontaneous-emission-absorbing layer 15A is 15% or more, then the spontaneous-emission-absorbing layer 15A is no longer transparent to the spontaneous emission that has been radiated from the active layer 17. Thus, the spontaneous-emission-absorbing layer 15A can absorb the spontaneous emission not contributing to the laser oscillation. In the illustrated embodiment, the thickness of each well layer is supposed to be about 5 nm or less.

The p-side electrode 21 is formed on the lower surface of the insulating film 20 by alternately stacking Ni and Au layers or Ni, Pt and Au layers thereon, for example, so as to fill in the striped openings of the insulating film 20.

On the principal surface of the submount 2, p- and n-side terminal electrodes 23 and 25 are formed to face the p- and n-side electrodes 21 and 14, respectively. The p- and n-side electrodes 21 and 14 are electrically connected to the p- and n-side terminal electrodes 23 and 25, respectively, with solder members 22 and 24 containing lead (Pb) and tin (Sn) or gold (Au).

As described above, even if current exceeding the threshold value thereof is being injected into the p- and n-side electrodes 21 and 14 of the nitride semiconductor laser device 1A, spontaneous emission, not contributing to laser oscillation, is continuously radiated from the active layer 17. Also, the spontaneous emission at a wavelength of about 410 nm is transmissible through any of the sapphire substrate 11, n- and p-type AlGaN cladding layers 16, 18 and n- and p-type GaN contact layers 13, 19. Thus, the spontaneous emission is radiated in all the directions around the active layer 17.

According to this embodiment, however, the spontaneous-emission-absorbing layer 15A with an In mole fraction larger than that of the active layer 17, i.e., with an energy gap smaller than that of the active layer 17, is provided between the n-type cladding layer 16 and n-type contact layer 13. That is to say, the spontaneous-emission-absorbing layer 15A is not transparent to the spontaneous emission that has been radiated from the active layer 17. As a result, the spontaneous emission is absorbed into the spontaneous-emission-absorbing layer 15A.

As can be seen, after the nitride semiconductor laser device 1A has been mounted on the submount 2, it is possible to substantially prevent the leakage of the spontaneous emission radiated from the active layer 17 toward the substrate 11. Thus, according to this embodiment, optical noise, which adversely affects optical elements around the substrate 11, can be greatly reduced.

Also, since the spontaneous-emission-absorbing layer 15A is provided in contact with the n-type cladding layer 16, the layer 15A is closest to the active layer 17 functioning as the light source. Accordingly, the spontaneous emission can be absorbed at a high efficiency.

In the foregoing embodiment, the spontaneous-emission-absorbing layer 15A is made of InGaN with an energy gap smaller than that of the active layer 17. Alternatively, the spontaneous-emission-absorbing layer 15A may be made of any other semiconductor compound so long as GaN semiconductor crystals can grow thereon.

Hereinafter, a method for fabricating the nitride semiconductor laser device 1A with such a structure will be described.

In the illustrated embodiment, a metalorganic vapor phase epitaxy (MOVPE) process is carried out to grow the nitride semiconductor crystals. Specifically, organometallic compound source materials such as trimethylaluminum (TMA), trimethylgallium (TMG) and trimethylindium (TMI) are introduced as Group III element sources into a reactor at an elevated temperature. In addition, ammonium ($NH_3$) gas is also introduced as a nitrogen source into the reactor, and the organometallic compound source materials and $NH_3$ gas are thermally decomposed within the reactor, thereby growing nitride semiconductor crystals on a substrate.

More specifically, first, the temperature of the substrate 11 placed within the reactor is set at about 600° C. Then, the GaN buffer layer 12 is grown on the principal surface of the substrate 11 with TMG and $NH_3$ introduced into the reactor. It is known that various defects such as cracking are less likely to be caused by providing such a "low-temperature buffer layer" on sapphire with a different lattice constant from those of GaN semiconductors. To grow an AlN buffer layer 12 on the substrate 11, TMG should be replaced with TMA.

Next, the temperature of the substrate 11 is raised to about 1000° C., and the n-type GaN contact layer 13 doped with Si as an n-type dopant is grown on the upper surface of the buffer layer 12 with TMG and $NH_3$ introduced into the reactor.

Subsequently, the temperature of the substrate 11 is lowered to about 800° C., and then the n-type $In_xGa_{1-x}N$ spontaneous-emission-absorbing layer 15A is grown on the upper surface of the n-type contact, layer 13 with TMI additionally supplied as another Group III element source.

Thereafter, the temperature of the substrate 11 is raised to about 1000° C. again, and then the n-type AlGaN cladding layer 16 is grown on the upper surface of the spontaneous-emission-absorbing layer 15A with TMG and TMA supplied as Group III element sources onto the substrate 11.

Next, the temperature of the substrate 11 is lowered to about 800° C. again, and then the $In_yGa_{1-y}N$ active layer 17 is grown on the upper surface of the n-type cladding layer 16 with the supply of TMA suspended and TMI supplied as an alternative Group III element source. For example, the active layer 17 may be a multiple quantum well active layer consisting of InGaN well layers and AlGaN barrier layers (each of which is 5 nm thick or less) alternately stacked. In that case, laser oscillation starts at a smaller threshold current.

Thereafter, the temperature of the substrate 11 is raised to about 1000° C. again and then the p-type AlGaN cladding layer 18 doped with Mg as a p-type dopant is grown on the upper surface of the active layer 17 with TMG and TMA supplied as Group III element sources onto the substrate 11. Then, the p-type GaN contact layer 19 is grown on the upper surface of the p-type cladding layer 18 with the supply of TMA suspended.

Next, the substrate on which these nitride semiconductor layers have been stacked one upon the other (i.e., an epitaxial substrate) is taken out of the reactor and the insulating film 20 of silicon dioxide, for example, is deposited on the upper surface of the p-type contact layer 19. Subsequently, the insulating film 20 is selectively etched, thereby forming striped openings in the insulating film 20.

Then, the p-side electrode 21 is formed as a stack of Ni and Au layers, for example, over the entire surface of the insulating film 20, as well as inside the openings, by an evaporation technique, for instance.

Next, part of the p-side electrode 21 in the active region is masked and the epitaxial layers are etched sequentially, thereby partially exposing the n-type contact layer 13 and defining the n-side electrode region. And the n-side electrode 14 is formed as a stack of Ti and Al layers, for example, by an evaporation technique, for instance.

Subsequently, the epitaxial substrate is cleaved to obtain a resonant cavity and the end facets of the cavity are coated with a predetermined material. Then, the substrate 11 of the nitride semiconductor laser device 1A is placed over the submount 2 such that the circuitry side of the substrate 11 faces the principal surface of the submount 2. And the p- and n-side electrodes 21, 14 are aligned with the p- and n-side terminal electrodes 23, 25, respectively. Thereafter, these electrodes 21, 23 and 14, 25 are bonded together with the solder 22 and 24, respectively. As a result, the nitride semiconductor laser device 1A shown in FIG. 1 is completed.

It should be noted that n- and p-type GaN optical guide layers may be inserted between the active layer 17 and the n-type cladding layer 16 and between the active layer 17 and the p-type cladding layer 18, respectively. In such a case, the radiation emitted can be confined in the active layer 17 even more efficiently and the threshold current can be further reduced.

Modified Example 1 of Embodiment 1

Hereinafter, a first modified example of the first embodiment of the present invention will be described with reference to FIG. 2.

Figure 2:
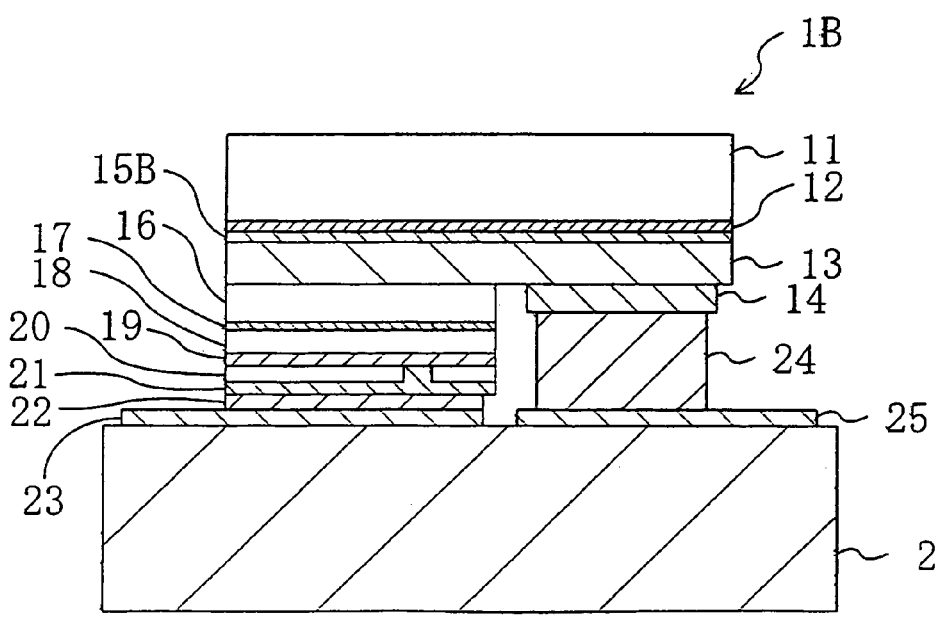
FIG. 2 is a cross-sectional view illustrating a structure of a nitride semiconductor laser device according to a first modified example of the first embodiment.

FIG. 2 illustrates a cross-sectional structure of a nitride semiconductor laser device 1B according to a first modified example of the first embodiment. In FIG. 2, the same members as those illustrated in FIG. 1 are identified by the same reference numerals and the description thereof will be omitted herein. As shown in FIG. 2, an n-type InGaN spontaneous-emission-absorbing layer 15B with an energy gap smaller than that of the active layer 17 is formed between the buffer layer 12 and the n-type contact layer 13 in the nitride semiconductor laser-device 1B according to this modified example.

In such a structure, the spontaneous-emission-absorbing layer 15B can entirely cover the principal surface of the substrate 11 and the leakage of the spontaneous emission, which has been radiated toward the substrate 11, can be prevented with much more certainty.

Also, if the spontaneous-emission-absorbing layer 15B is grown at a low temperature, then the layer 15B may be part of the buffer layer 12 and does not constitute an excessive burden on the fabrication process.

Modified Example 2 of Embodiment 1

Hereinafter, a second modified example of the first embodiment of the present invention will be described with reference to FIG. 3.

Figure 3:
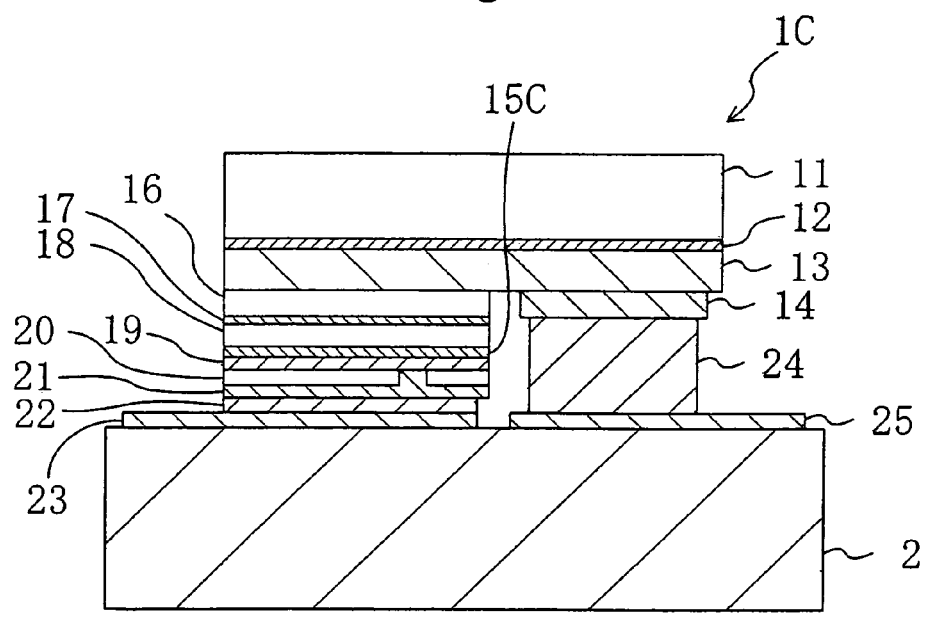
FIG. 3 is a cross-sectional view illustrating a structure of a nitride semiconductor laser device according to a second modified example of the first embodiment.

FIG. 3 illustrates a cross-sectional structure of a nitride semiconductor laser device 1C according to a second modified example of the first embodiment. In FIG. 3, the same members as those illustrated in FIG. 1 are identified by the same reference numerals and the description thereof will be omitted herein. As shown in FIG. 3, a p-type InGaN spontaneous-emission-absorbing layer 15C with an energy gap smaller than that of the active layer 17 is formed between the p-type cladding layer 18 and the p-type contact layer 19 in the nitride semiconductor laser device 1C according to this modified example. In this case, the spontaneous-emission-absorbing layer 15C should be of p-type and Mg is used as a p-type dopant.

In such a structure, the spontaneous-emission-absorbing layer 15C can substantially prevent the leakage of the spontaneous emission that has been radiated from the active layer 17 toward the p-side electrode 21.

Modified Example 3 of Embodiment 1

Hereinafter, a third modified example of the first embodiment of the present invention will be described with reference to FIG. 4.

Figure 4:
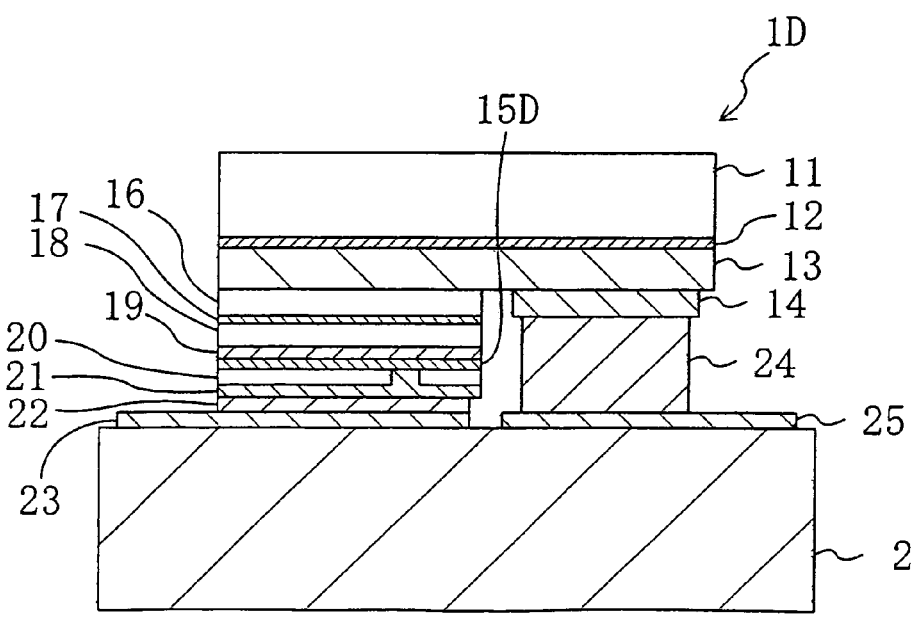
FIG. 4 is a cross-sectional view illustrating a structure of a nitride semiconductor laser device according to a third modified example of the first embodiment.

FIG. 4 illustrates a cross-sectional structure of a nitride semiconductor laser device 1D according to a third modified example of the first embodiment. In FIG. 4, the same members as those illustrated in FIG. 1 are identified by the same reference numerals and the description thereof will be omitted herein. As shown in FIG. 4, a p-type InGaN spontaneous-emission-absorbing layer 15D with an energy gap smaller than that of the active layer 17 is formed between the p-type contact layer 19 and the p-side electrode 21 in the nitride semiconductor laser device 1D according to this modified example.

In such a structure, the spontaneous-emission-absorbing layer 15D has a smaller energy gap, and therefore a lower contact resistance, than the p-type GaN contact layer 19. As a result, the threshold voltage can be reduced.

As described above, any of the spontaneous-emission-absorbing layers 15A through 15D is provided within the epitaxial layers of the laser structure according to the first embodiment and its modified examples. The closer to the active layer 17 the spontaneous-emission-absorbing layer is, the greater proportion of the laser radiation is unintentionally absorbed into the spontaneous-emission-absorbing layer, thus increasing the loss during laser oscillation. As a result, the oscillation threshold current increases to the contrary. Accordingly, the laser structure should be designed while carefully considering the distribution of laser radiation.

Embodiment 2

Hereinafter, a second embodiment of the present invention will be described with reference to FIG. 5.

Figure 5:
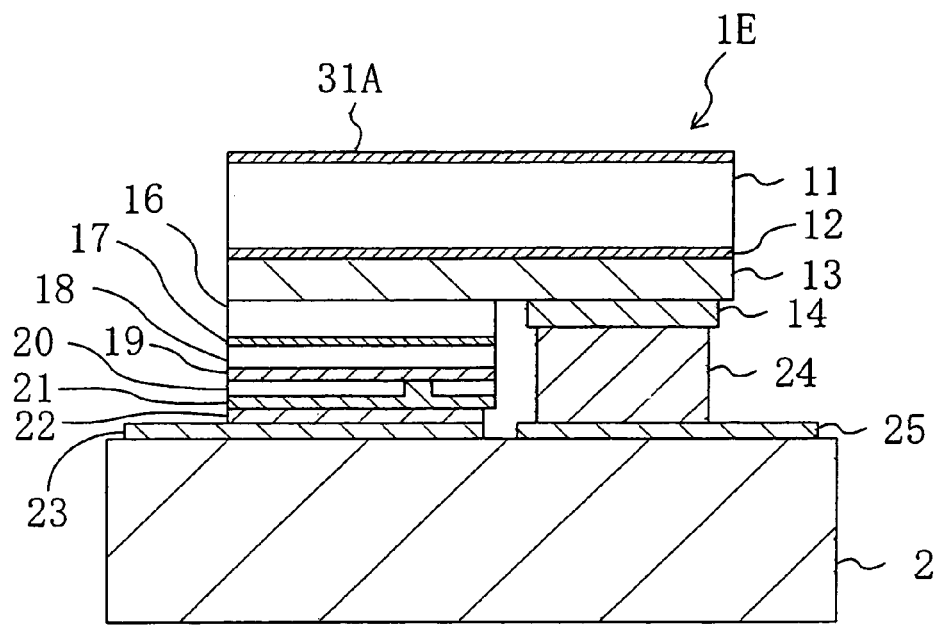
FIG. 5 is a cross-sectional view illustrating a structure of a nitride semiconductor laser device according to a second embodiment of the present invention.

FIG. 5 illustrates a cross-sectional structure of a nitride semiconductor laser device 1E according to the second embodiment. In FIG. 5 the same members as those illustrated in FIG. 1 are identified by the same reference numerals and the description thereof will be omitted herein. According to the second embodiment, the spontaneous-emission-absorbing layer is provided on an outer surface of the laser chip body, not in the epitaxial layers as in the first embodiment.

As shown in FIG. 5, a spontaneous emission protective film 31A for absorbing or reflecting the spontaneous emission radiated from the active layer 17 is formed on a surface of the sapphire substrate 11 opposite to its circuitry side, i.e., its backside, in the nitride semiconductor laser device 1E according to the second embodiment.

In the illustrated embodiment, crystalline or amorphous silicon with an energy gap smaller than that of the spontaneous emission is used as a material for absorbing the spontaneous emission radiated from the InGaN active layer 17. This silicon (Si) film may be formed by sputtering, for example. Alternatively, any material other than Si may be used so long as the material has an energy gap smaller than the energy of the spontaneous emission and is easily compatible with the process.

The film 31A may also be made of a material strongly reflecting the spontaneous emission radiated from the active layer 17. For example, the film 31A may be an Au film or a stack of Au and other metal films, e.g., a stack of Ti, Pt and Au films. The metal film or the multilayer structure may be formed by an electron beam evaporation or resistance heating evaporation technique.

Examples of the materials for the spontaneous emission protective film 31A include not only Au, Ti and Pt, but also Cr, Sn, Cu, Fe, Ag and In. The spontaneous emission protective film 31A may be a single-layered film of any of these metals, a multilayer structure consisting of at least two of these metal films or a film made of an alloy containing at least two of these metals (e.g., Au and Sn).

Furthermore, the spontaneous emission protective film 31A may be a combination of an absorptive film and a high-reflectance film. For example, even more remarkable effects are attainable if a high-reflectance film of Au is deposited on an absorptive film of Si.

As can be seen, after the nitride semiconductor laser device 1E has been mounted on the submount 2, it is possible to substantially prevent the leakage of the spontaneous emission that has been radiated from the active layer 17 toward the substrate 11. Thus, according to this embodiment, optical noise, which adversely affects optical elements disposed around the substrate 11, can be greatly reduced in the nitride semiconductor laser device 1E.

Modified Example 1 of Embodiment 2

Hereinafter, a first modified example of the second embodiment of the present invention will be described with reference to FIG. 6.

Figure 6:
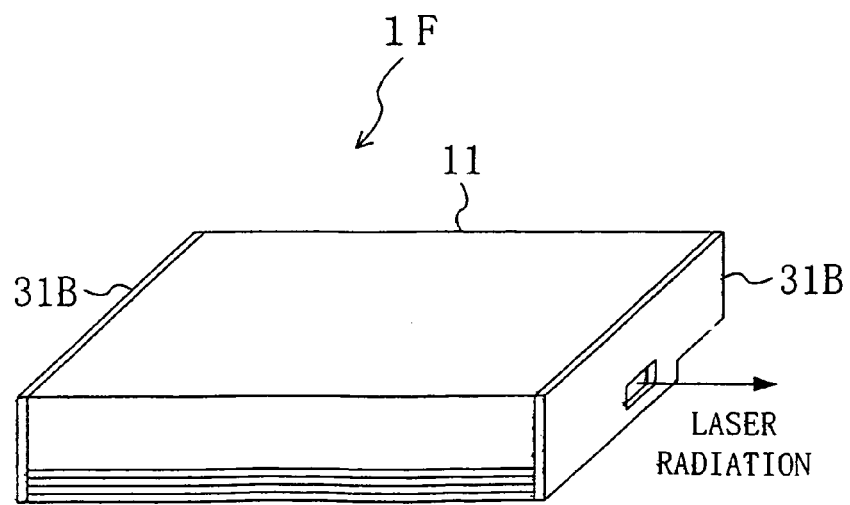
FIG. 6 is a perspective view illustrating a nitride semiconductor laser device according to a first modified example of the second embodiment.

FIG. 6 illustrates the appearance of a nitride semiconductor laser device 1F according to a first modified example of the second embodiment. In FIG. 6, the same member as that illustrated in FIG. 1 is identified by the same reference numeral and the description thereof will be omitted herein. As shown in FIG. 6, spontaneous emission protective films 31B for absorbing or reflecting spontaneous emission radiated from the active layer are formed on an emissive end facet of the laser chip body, except for a portion of the active layer from which laser radiation is emitted, and on a reflective end facet facing the emissive end facet, in the nitride semiconductor laser device 1F according to this modified example.

The size of that portion of the active layer, from which the laser radiation is emitted, is about 5 μm square. Also, unless monitoring laser radiation is not emitted through the reflective end facet, for example, the spontaneous emission protective film 31B is preferably formed over the entire surface of the reflective end facet. In such a case, the threshold value of oscillation can be further reduced.

The absorptive film is preferably an Si film as in the second embodiment. The high-reflectance film may be the metal film exemplified above. However, when a conductive film made of a metal, for example, is provided, an insulating film of $SiO_2$ or the like should be formed in advance as an undercoat so as not to cause electrical shortcircuit among the semiconductor layers.

In this modified example, the spontaneous emission protective films 31B are provided on the end facets of the laser chip body, which cross at right angles with the direction in which the laser radiation resonates. Thus, these spontaneous emission protective films 31B should be reflective films rather than absorptive films. This is because the spontaneous emission that has been reflected from the spontaneous emission protective films 31B can contribute to laser oscillation.

The high-reflectance film may be a stack of dielectric films, e.g., $SiO_2$ and $TiO_2$ films. In such a case, if $SiO_2$ and $TiO_2$ films, each being one-fourth as thick as the wavelength of the spontaneous emission, are stacked alternately three times, then a reflectance up to 94% is attainable.

As can be seen, the leakage of the spontaneous emission, which has been radiated from the active layer 17 in the direction approximately parallel to the longitudinal direction of the resonant cavity, can be substantially prevented in this modified example. Thus, optical noise that adversely affects optical elements placed in the direction in which the laser radiation is emitted from the nitride semiconductor laser device 1F and in the direction opposite to the former direction can be greatly reduced.

Modified Example 2 of Embodiment 2

Hereinafter, a second modified example of the second embodiment of the present invention will be described with reference to FIG. 7.

Figure 7:
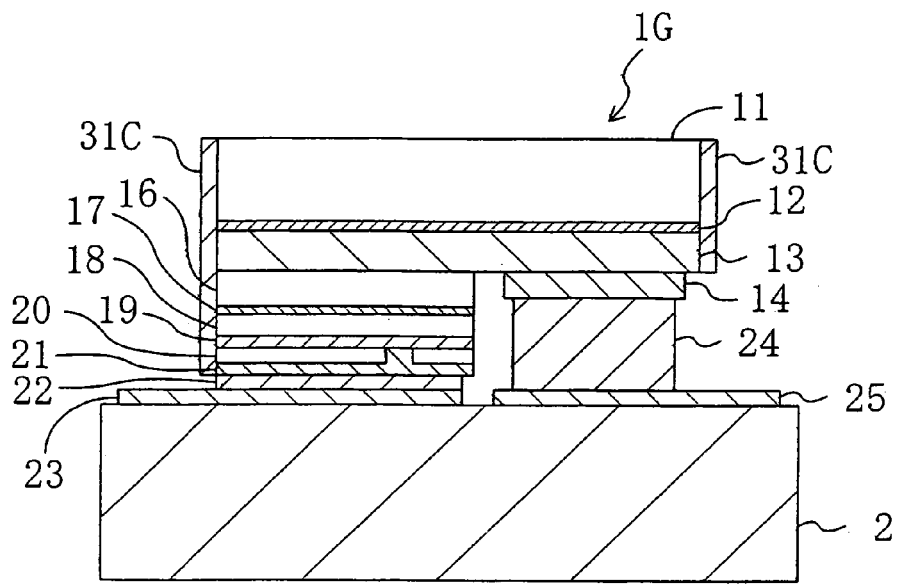
FIG. 7 is a cross-sectional view illustrating a structure of a nitride semiconductor laser device according to a second modified example of the second embodiment.

FIG. 7 illustrates a cross-sectional structure of a nitride semiconductor laser device 1G according to a second modified example of the second embodiment. In FIG. 7, the same members as those illustrated in FIG. 1 are identified by the same reference numerals and the description thereof will be omitted herein. As shown in FIG. 7, spontaneous emission protective films 31C for absorbing or reflecting the spontaneous emission radiated from the active layer 17 are formed on side faces of the laser chip body that are parallel to the direction in which the laser radiation is emitted in the nitride semiconductor laser device 1G according to this modified example.

The absorptive film is preferably an Si film as in the second embodiment. The high-reflectance-film may be the metal film exemplified above (e.g., Au film). However, when a conductive film made of a metal, for example, is provided, an insulating film of $SiO_2$ or the like should be formed in advance as an undercoat so as not to cause electrical shortcircuit among the semiconductor layers.

Furthermore, each of the spontaneous emission protective films 31C may be a combination of absorptive and high-reflectance films. For example, a high-reflectance film of Au may be deposited on an absorptive film of Si.

As can be seen, the leakage of the spontaneous emission, which has been radiated from the active layer 17 in a direction approximately vertical to the longitudinal direction of the resonant cavity, can be substantially prevented in this modified example. Thus, optical noise that adversely affects optical elements placed in the direction vertical to the longitudinal direction of the resonant cavity can be greatly reduced.

If the first and second embodiments of the present invention and their modified examples are adopted in combination, then the leakage of the spontaneous emission out of the laser chip body can be eliminated almost completely.

In order not to get the fabrication process too complicated, the spontaneous-emission-absorbing layer 15A of the first embodiment shown in FIG. 1 or the layer 15B of the first modified example thereof shown in FIG. 2 and the spontaneous emission protective film 31A of the second embodiment shown in FIG. 5 may be provided as absorptive and high-reflectance films for a single semiconductor laser device.

Figure 8:
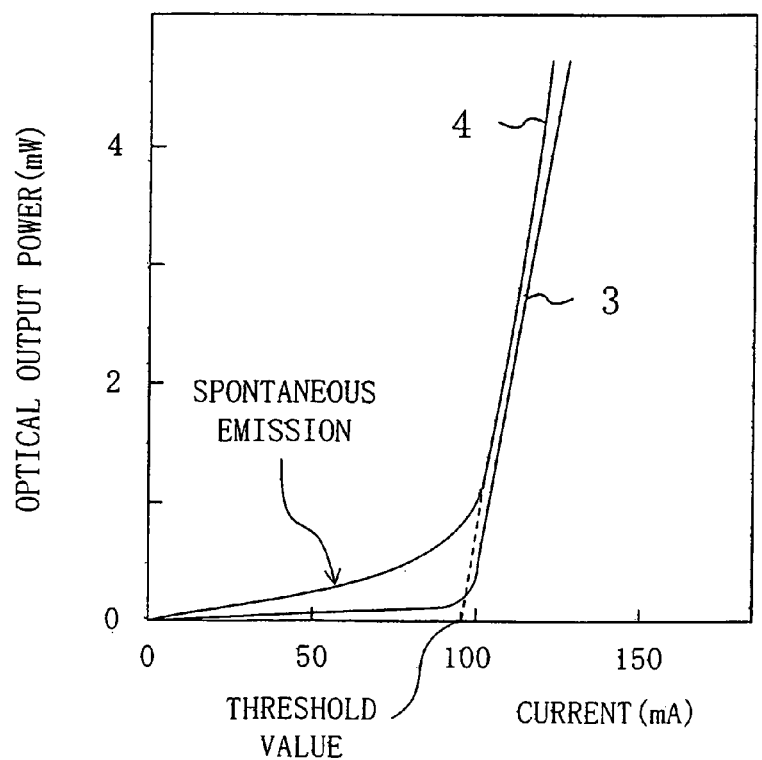
FIG. 8 is a graph illustrating how the optical output power changes with the injected current in inventive and conventional nitride semiconductor laser devices.

FIG. 8 illustrates how the optical output power changes with the injected current in an inventive nitride semiconductor laser-device, which is provided with the spontaneous-emission-absorbing layer 15A and the spontaneous emission protective film 31A, and a prior art nitride semiconductor laser device. In FIG. 8, the axis of abscissas represents the current (mA) injected into the laser device, while the axis of ordinates represents the output power (mW) of the laser radiation. The characteristic curves 3 and 4 correspond to the inventive and prior art laser devices, respectively. As can be seen from the curve 4 shown in FIG. 8, leakage of spontaneous emission is observed in the prior art semiconductor laser device until the current reaches the threshold value of oscillation. In contrast, as represented by the curve 3, almost no spontaneous emission is output and only the laser radiation is emitted in the vicinity of the threshold value of oscillation in the inventive semiconductor laser device.

Embodiment 3

Hereinafter, a third embodiment of the present invention will be described with reference to FIG. 9.

Figure 9:
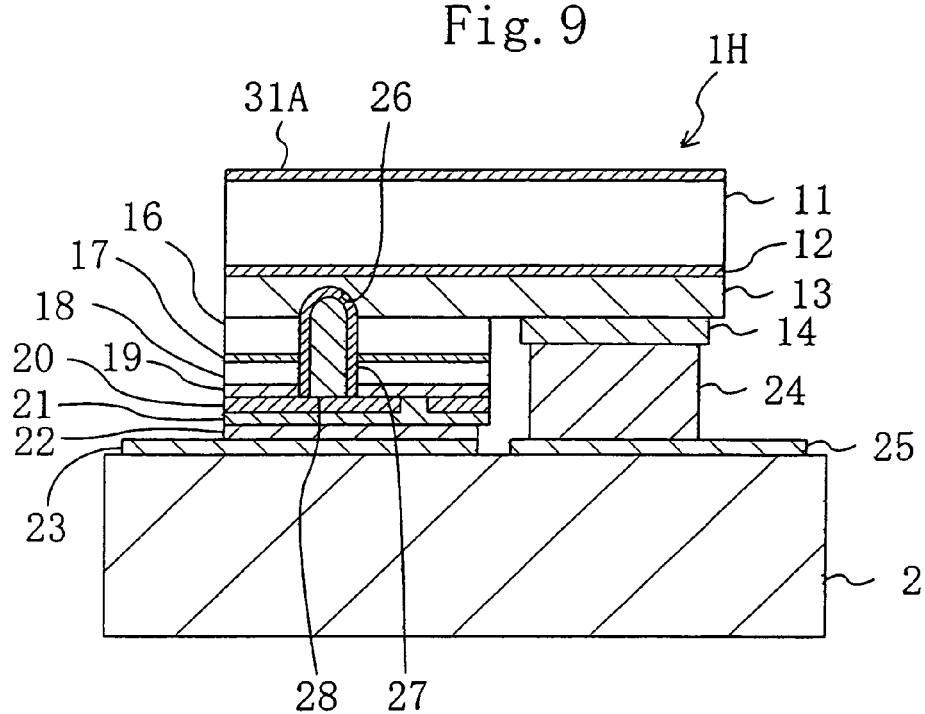
FIG. 9 is a cross-sectional view illustrating a structure of a nitride semiconductor laser device according to a third embodiment of the present invention.

FIG. 9 illustrates a cross-sectional structure of a nitride semiconductor laser device 1H according to a third embodiment of the present invention. In FIG. 9, the same members as those illustrated in FIG. 5 are identified by the same reference numerals and the description thereof will be omitted herein. As shown in FIG. 9, recess 26 is formed by etching beside a region (i.e., so-called "striped region") in which current is injected from the p-side electrode 21 of the laser chip body in the nitride semiconductor laser device 1H according to the third embodiment. The recess 26 vertically extends from the p-type contact layer 19 to the n-type contact layer 13 to divide the active layer 17 into two in the longitudinal direction of the resonant cavity. The recess 26 horizontally extends substantially in parallel to the current injection region.

In addition, the spontaneous emission protective film 31A of silicon, for example, is formed on a surface of the substrate 11 opposite to its circuitry side.

An insulating film 27 of silicon dioxide, for example, is deposited on the inner wall of the recess 26. And the recess 26 is filled in with a spontaneous-emission-absorbing member 28 that can absorb the spontaneous emission, e.g., gold (Au). The spontaneous-emission-absorbing member 28 is formed on the insulating film 27 by an evaporation technique, for example.

The total thickness of the laser chip body, which is implemented as a multilayer structure formed by the MOVPE process, is as small as about 5 µm. However, since the laser chip body includes multiple semiconductor layers stacked one upon the other, the spontaneous emission that is radiated from these semiconductor layers in the direction parallel to the surface of the substrate is non-negligible.

According to this embodiment, a spontaneous-emission-absorbing region is defined by the recess 26 filled in with the spontaneous-emission-absorbing member 28 to divide the active layer 17 into two beside the current injection region of the laser chip body. Thus, the spontaneous emission that is radiated in the direction parallel to the surface of the substrate 11 can be absorbed into the spontaneous-emission-absorbing region.

In the illustrated embodiment, the spontaneous-emission-absorbing member 28 is made of Au. Alternatively, the spontaneous-emission-absorbing member 28 may also be made of any other metal like Ti, Cr, Sn, Cu, Fe, Ag, Pt or In. The spontaneous-emission-absorbing member 28 may also be a multilayer structure consisting of at least two of these metal films (e.g., Ti and Au films) or a film made of an alloy containing at least two of these metals. Also, the spontaneous-emission-absorbing member 28 may be made of a semiconductor with a relatively small energy gap, e.g., single crystalline or amorphous silicon.

In the third embodiment, the spontaneous-emission-absorbing member 28 is provided beside the current injection region of the laser chip body on the side opposite to the n-side electrode 14, i.e., on the left-hand side of FIG. 9. Alternatively, the spontaneous-emission-absorbing member 28 may be provided on the same side as the n-side electrode 14, i.e., on the right-hand side of FIG. 9.

It is noted that even if no recess 26 is provided beside the current injection region on the same side as the n-side electrode 14 as shown in. FIG. 9, the spontaneous emission is still absorbable into the solder member 24 interposed between the n-side electrode 14 and terminal electrode 25. Also, the solder member 22 containing Pb and Sn may be replaced with a member made of a spontaneous-emission-absorbing material, e.g., conductive adhesive or silver paste.

Moreover, the recess 26 has only to absorb the spontaneous emission that is radiated from the active layer 17 in various directions other than the direction in which the waveguide extends. Thus, the recess 26 does not always have to extend in parallel to the current injection region.

As for the optical output power changing with the injected current, we confirmed that the nitride semiconductor laser device according to the third embodiment exhibits a similar characteristic to that represented by the curve 3 in FIG. 8.

As can be seen, the spontaneous-emission-absorbing member 28 provided inside the laser chip body and the spontaneous emission protective film 31A provided on the backside of the substrate 11 opposite to its circuitry side can reduce the leakage of the spontaneous emission radiated from the laser chip. Thus, coherent laser radiation can be obtained according to this embodiment just as intended. Also, since a photodiode used for monitoring the optical output power is less affected by the spontaneous emission, the output power of the laser radiation is controllable more precisely.

Embodiment 4

Hereinafter, a fourth embodiment of the present invention will be described with reference to FIG. 10.

Figure 10:
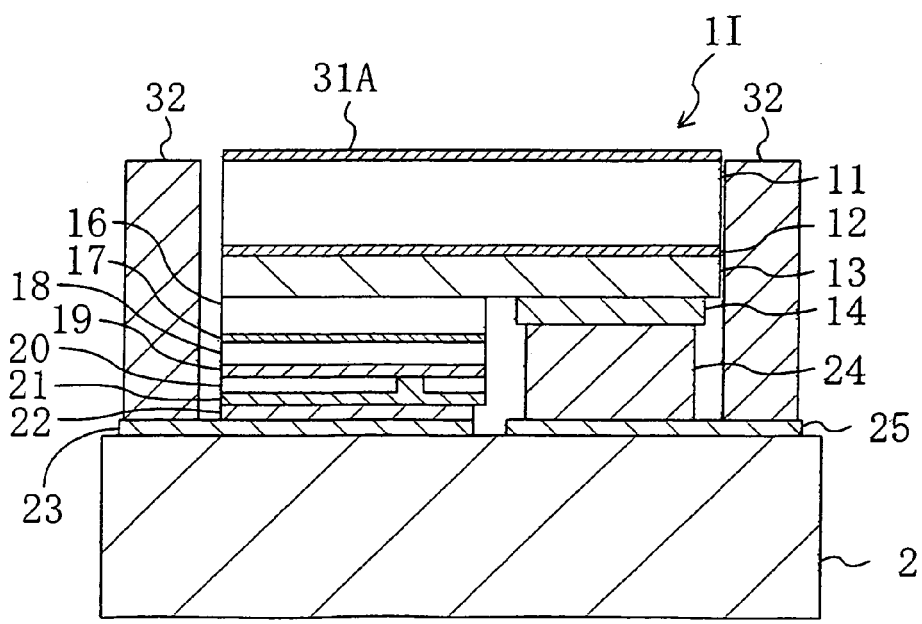
FIG. 10 is a cross-sectional view illustrating a structure of a nitride semiconductor laser device according to a fourth embodiment of the present invention.

FIG. 10 illustrates a cross-sectional structure of a nitride semiconductor laser device 1I according to a fourth embodiment of the present invention. In FIG. 10, the same members as those illustrated in FIG. 5 are identified by the same reference numerals and the description thereof will be omitted herein. As shown in FIG. 10, spontaneous emission protective walls 32 for absorbing or reflecting the spontaneous emission radiated from the active layer 17 are provided for the nitride semiconductor laser device 1I according to this embodiment. The spontaneous emission protective walls 32 are provided over the submount 2 with the p- and n-side terminal electrodes 23 and 25 interposed therebetween and are spaced apart from the side faces of the laser chip body that are parallel to the direction in which the laser radiation is emitted.

In addition, the spontaneous emission protective film 31A of Au or Si, for example, is formed on the backside of the substrate 11 opposite to its circuitry side as in the second embodiment.

The spontaneous emission protective walls 32 may be made of the same material as that of the spontaneous emission protective film 31A. A material that can absorb the spontaneous emission radiated from the laser chip is preferably used.

The spontaneous emission protective walls 32 may be formed in the following manner. First, block members of the metal exemplified above or SiC are prepared as bulks or sintered compacts. Then, the block members are bonded onto the p- and n-side terminal electrodes 23, 25 of the submount 2 with solder, for example, so as to be spaced apart from the side faces of the laser chip. An insulating film may be interposed between the p- or n-side terminal electrode 23 or 25 and the spontaneous emission protective wall 32.

Alternatively, a thin film of the metal exemplified above may be deposited by evaporation on the surface of a block member made of glass and the coated block member may be bonded onto each terminal electrode 23, 25 with an adhesive, for example.

As can be seen, the spontaneous emission protective walls 32 provided for the laser chip body so as to be spaced apart from the side faces thereof parallel to the direction in which the laser radiation is emitted and the spontaneous emission protective film 31A provided on the backside of the substrate 11 opposite to its circuitry side can reduce the leakage of the spontaneous emission radiated from the laser chip. Thus, coherent laser radiation can be obtained according to this embodiment just as intended.

Also, both the spontaneous emission protective film 31A and walls 32 according to this embodiment are less likely to cause damage to the epitaxial layers of the laser chip.

It should be noted that only one spontaneous emission protective wall 32 may be provided for a side face of the laser chip body in parallel to the direction in which the laser radiation is emitted.

Furthermore, if the substrate 11 is not made of sapphire with insulation properties but made of a conductor, e.g., n-type GaN, then the spontaneous emission protective film 31A may be used as the n-side electrode 14.

Modified Example of Embodiment 4

Hereinafter, a modified example of the fourth embodiment of the present invention will be described with reference to FIGS. 11(a) and 11(b).

Figure 11A:
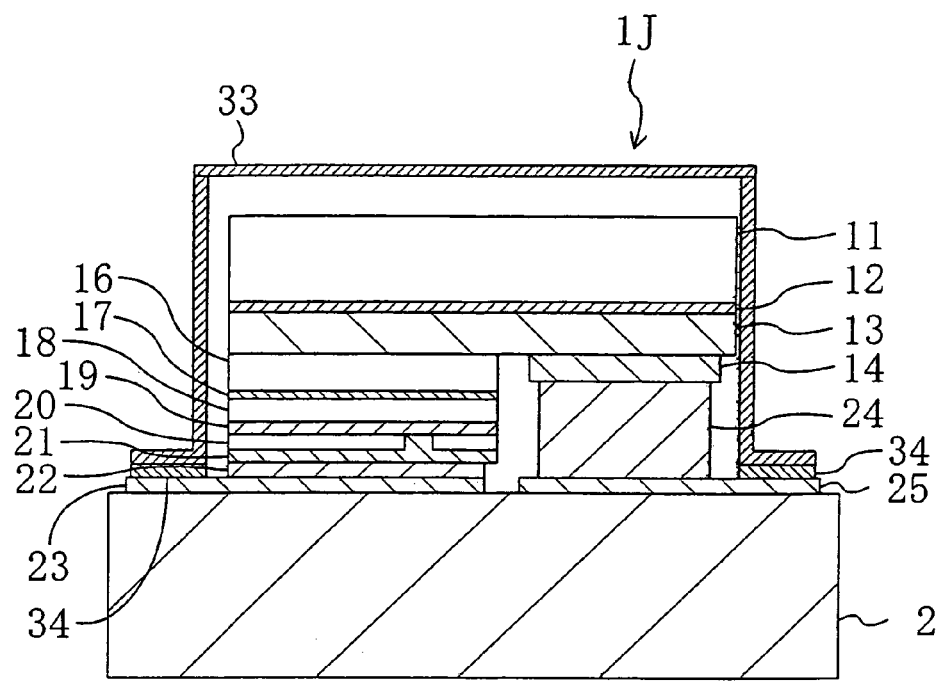
FIGS. 11(a) and 11(b) are respectively cross-sectional view and perspective view illustrating a nitride semiconductor laser device according to a modified example of the fourth embodiment.
Figure 11B:
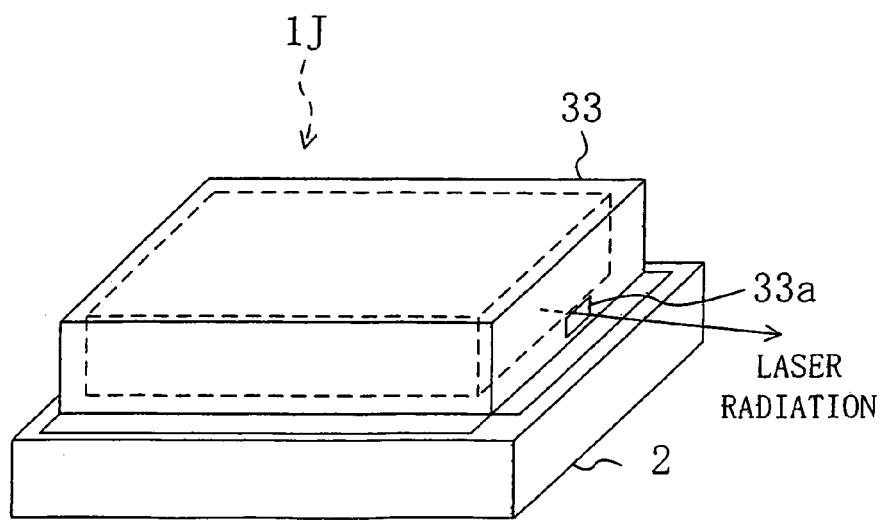

FIGS. 11(a) and 11(b) respectively illustrate cross-sectional structure and appearance of a nitride semiconductor laser device 1J according to a modified example of the fourth embodiment. In FIGS. 11(a) and 11(b), the same members as those illustrated in FIG. 10 are identified by the same reference numerals. As shown in FIGS. 11(a) and 11(b), a cover-like light-blocking case 33 made of a metal containing Au, Ti or Pt is provided over the submount 2 so as to cover the laser chip body entirely in the nitride semiconductor laser device 1J according to this modified example. The bottom of the light-blocking case 33 is spaced apart from the backside of the substrate 11 opposite to its circuitry side, while the inner walls thereof are spaced apart from the side faces of the laser chip body. Also, the light-blocking case 33 is bonded onto the p- and n-side terminal electrodes 23 and 25 with an insulating film 34 interposed therebetween.

Moreover, as shown in FIG. 11(b), the light-blocking case 33 is provided with an opening 33a for outputting the laser radiation therethrough. The opening 33a is so located as to face a part of the laser chip from which the laser radiation is emitted. Since the width of the current injection region of the active layer 17 is about 5 μm, the spot diameter of the laser radiation at the emissive end facet is approximately 5 μm square. Thus, the size of the opening 33a may be equal to or slightly larger than 5 μm.

Furthermore, if the output power of the laser radiation should be monitored, then another opening (not shown) of the same shape as the opening 33a may be provided for another side face of the light-blocking case 33 so as to face the opening 33a.

Also, depending on the intended application of the nitride semiconductor laser device 1J, not all the four sides of the laser chip body have to be covered with the case 33. For example, at least one, or both, of the side plates of the light-blocking case 33, which cross the optical axis of the laser radiation at right angles, may be omitted.

As for the optical output power changing with the injected current, we confirmed that the nitride semiconductor laser device according to the fourth embodiment or its modified example exhibits a similar characteristic to that represented by the curve 3 in FIG. 8.

In all of the nitride semiconductor laser devices 1A through 1J described above, the p-type contact layer 19 is covered with the insulating film 20 with striped openings, thereby defining striped current injection regions in the active layer 17. Alternatively, to improve the controllability of the laser radiation in transverse mode, the p-type contact layer 19 and cladding layer 18 may be formed in a ridge shape.

It should be noted that the present invention is applicable not only to the nitride semiconductor laser device including the InGaN active layer 17, but also to a nitride semiconductor laser device including a substrate 11 with an energy gap larger than that of the active layer 17.

In the foregoing embodiments, nitride semiconductor crystals are grown by the MOVPE process. Alternatively, the crystals may be grown by a molecular beam epitaxy (MBE) process or a halide vapor phase epitaxy (H-VPE) process, for example.

Embodiment 5

Hereinafter, a fifth embodiment of the present invention will be described with reference to FIG. 12.

Figure 12:
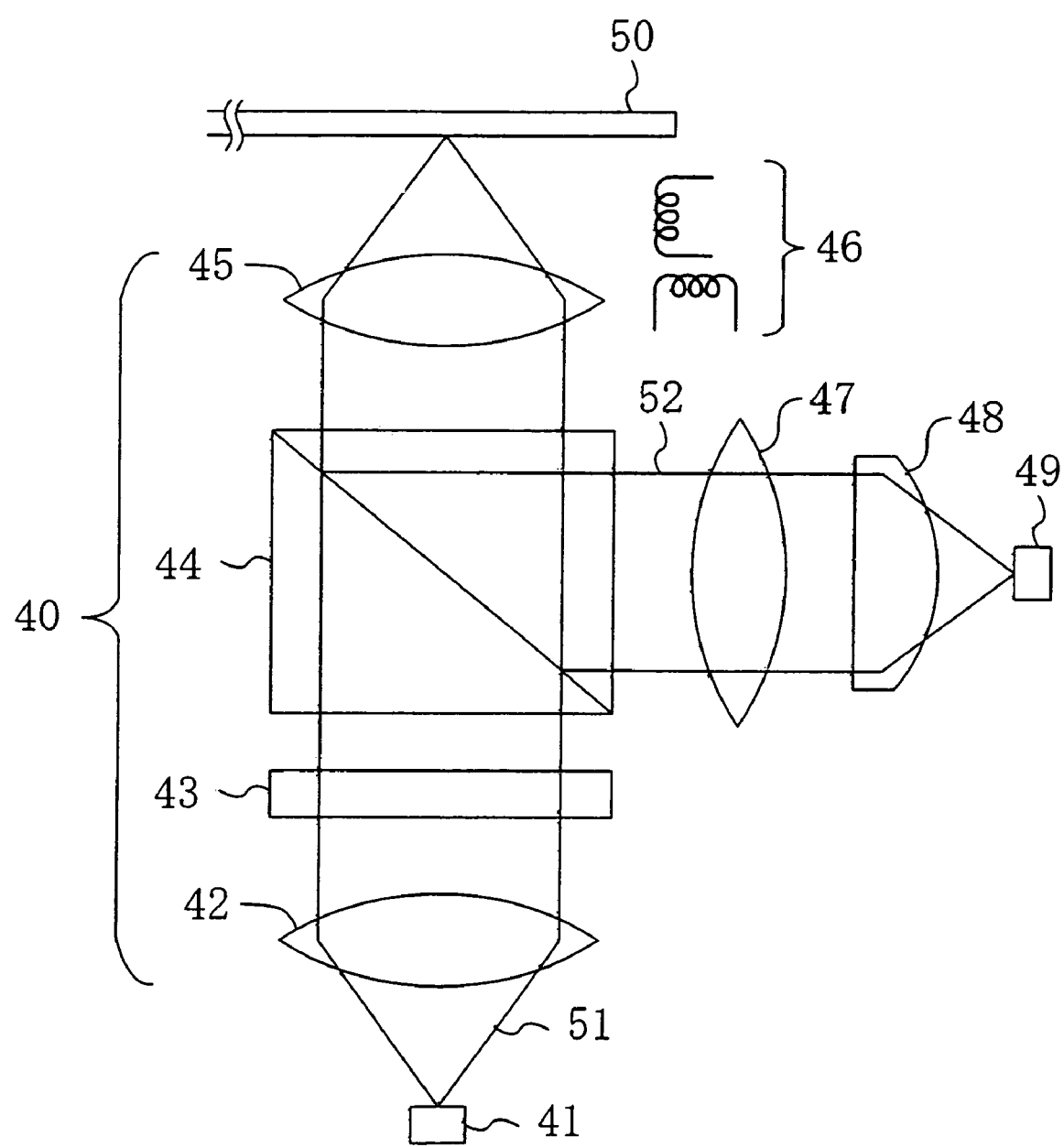
FIG. 12 schematically illustrates an arrangement of an optical disk apparatus according to a fifth embodiment of the present invention.

FIG. 12 schematically illustrates an arrangement of an optical disk apparatus according to the fifth embodiment. The optical disk apparatus of the fifth embodiment uses the inventive nitride semiconductor laser device 41 as a light source thereof. As shown in FIG. 12, the semiconductor laser device 41 is disposed at such a position that the emissive end facet thereof faces the data-retaining side of an optical disk 50, i.e., a storage medium on which desired data has been recorded. And a condensing optical system 40 is provided between the semiconductor laser device 41 and the optical disk 50 in this optical disk apparatus.

The condensing optical system 40 includes collimator lens 42, diffraction grating 43, half prism 44 and condenser lens 45, which are placed in this order such that the collimator lens 42 is closest to the semiconductor laser device 41. The collimator lens 42 collimates outgoing radiation 51, which has been emitted from the semiconductor laser device 41, into parallel light. The diffraction grating 43 splits the parallel light into three beams (not shown). The half prism 44 transmits the outgoing radiation 51 and changes the optical path of light 52 that has been reflected from the optical disk 50. And the condenser lens 45 condenses the three beams onto the optical disk 50. In the illustrated embodiment, laser radiation with a wavelength of about 410 nm is used as the outgoing radiation 51.

Each of the three beams is condensed on the optical disk 50 as a spot with a diameter of about 0.4 µm. An optical disk drive 46 is further provided to correct a radial focus error, which is detected from the optical disk 50 based on these three spots, by moving the condenser lens 45 over an appropriate distance.

On the optical path of the reflected light 52 outgoing from the half prism 44, provided are a receiving lens 47 for converging the reflected light 52, a cylindrical lens 48 for detecting a focus error, and a photodiode 49 for converting the condensed reflected light 52 into electrical signals.

As described above, the optical disk apparatus includes the condensing optical system 40 for guiding the outgoing radiation 51 emitted from the semiconductor laser device 41 onto the optical disk 50 and the photodiode 49 receiving the light 52 that has been reflected from the optical disk 50. And this apparatus further includes the semiconductor laser device 41 as a light source that can minimize or substantially prevent the leakage of spontaneous emission. Thus, even if data has been recorded on the optical disk 50 at a high density, the optical disk apparatus can read out data from the disk 50 with an increased SNR. As a result, this apparatus can perform a readout (reproduction) operation with lower distortion.

In recording data on the optical disk 50, the output power of the laser radiation should be controlled precisely over a wide range from as low as about 5 mW to as high as about 30 mW. This is because tracking should be performed with low output power responsive to an address specified before data is written onto the disk 50 at 30 mW.

The optical disk apparatus according to the fifth embodiment can substantially prevent the spontaneous emission, which will be a non-negligible source of noise, from leaking out of the semiconductor laser device 41. Thus, a monitoring photodiode (not shown) that monitors the optical output power of the semiconductor laser device 41 can convert the output power of the laser radiation into current more accurately. Specifically, when the optical output power of the semiconductor laser device 41 is changed, the monitor current changes linearly in that situation. Accordingly, the output operation of the semiconductor laser device 41 can be controlled far more precisely and the performance of the optical disk apparatus is enhanced during both recording and reproducing operations.

Embodiment 6

Hereinafter, a sixth embodiment of the present invention will be described with reference to FIG. 13.

Figure 13:
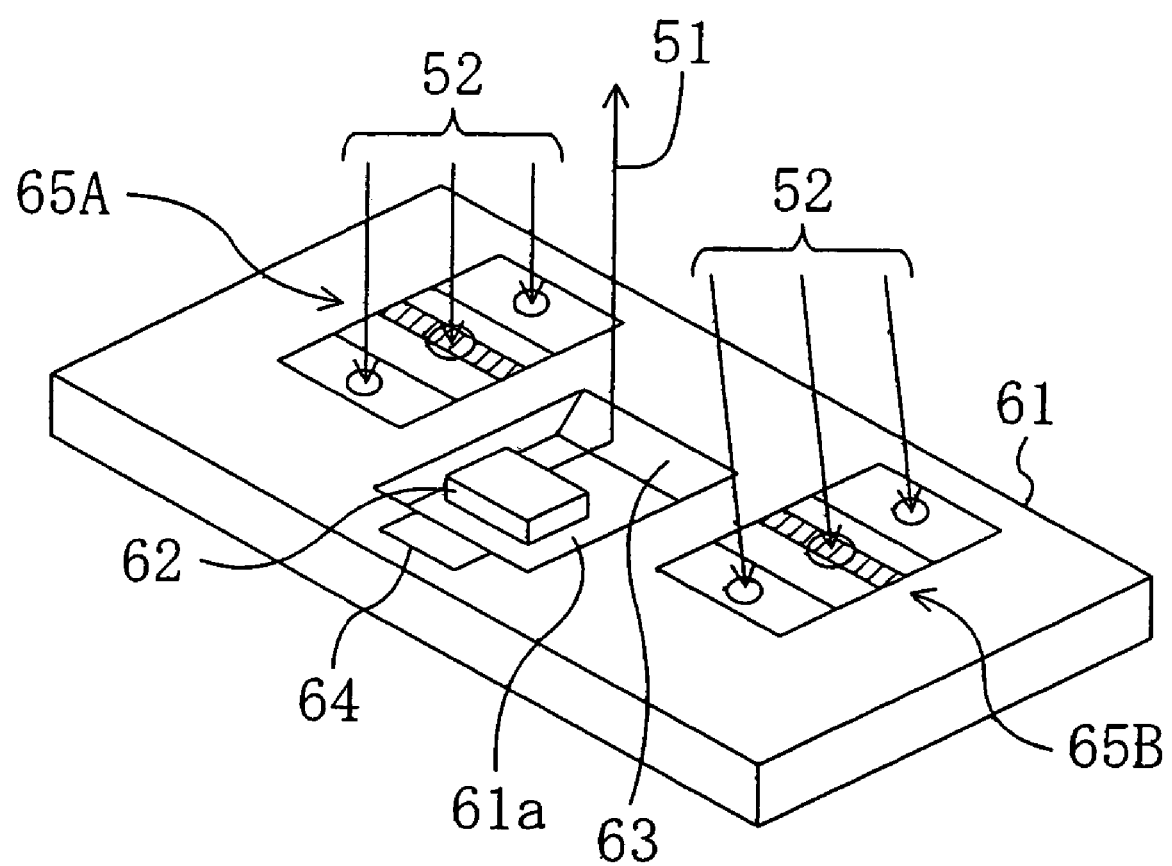
FIG. 13 is a perspective view schematically illustrating an optical integrated unit according to a sixth embodiment of the present invention.

FIG. 13 schematically illustrates a configuration for an optical integrated unit according to the sixth embodiment. As shown in FIG. 13, the optical integrated unit of this embodiment is formed on a single support member 61 of Si. A concave portion 61a is provided in the principal surface of the support member 61, and the inventive semiconductor laser device 62 is bonded onto the bottom of the concave portion 61a with solder, for example. A micro mirror 63 is provided on a sidewall of the concave portion 61a so as to face the emissive end facet of the semiconductor laser device 62 and to form an angle of 45 degrees with the principal surface of the support member 61. In this arrangement, the outgoing radiation 51 that has been emitted from the laser chip 62 is reflected from the micro mirror 63 to advance substantially vertically to the principal surface of the support member 61. In this case, the micro mirror 63 is preferably a (111) crystallographic plane of Si.

A monitoring photodiode 64 is formed on another sidewall of the concave portion 61a of the support member 61 so as to face the micro mirror 63. The photodiode 64 monitors the optical output power of the laser chip 62 based on the laser radiation that has been emitted in a small quantity from the reflective end facet of the semiconductor laser device 62. The surface of the micro mirror 63 may be either Si or be coated with a metal thin film of Au, Ag or Al.

First and second photodiodes 65A and 65B are provided as photodetectors for receiving the light 52 that has been reflected from the optical disk (not shown). The photodiodes 65A and 65B are located in the upper part of the support member 61 so as to be parallel to the reflective plane of the micro mirror 63 and to interpose the micro mirror 63 therebetween.

As can be seen, the light-emitting and receiving sections are integrated together on a single support member of the optical integrated unit. Thus, this optical integrated unit can be smaller in size and thickness. In addition, since the semiconductor laser device 62 that can suppress the leakage of spontaneous emission to a minimum level is used as the light-emitting section, the SNR at the light-receiving section can be increased advantageously.

Embodiment 7

Hereinafter, a seventh embodiment of the present invention will be described with reference to the accompanying drawings.

In the seventh embodiment, an assembly that can perform highly precise automatic power control (APC) on a semiconductor laser device will be described.

Generally speaking, the optical output power of a semiconductor laser device changes depending on the current flowing through a laser chip. Thus, when a semiconductor laser device is applied to an optical disk apparatus or an optical information processor such as an optical communications unit, the current flowing through the semiconductor laser device is regulated to obtain predetermined optical output power. Hereinafter, this relation between current and optical output power will be described in further detail with reference to graphic representations.

Figure 16A:
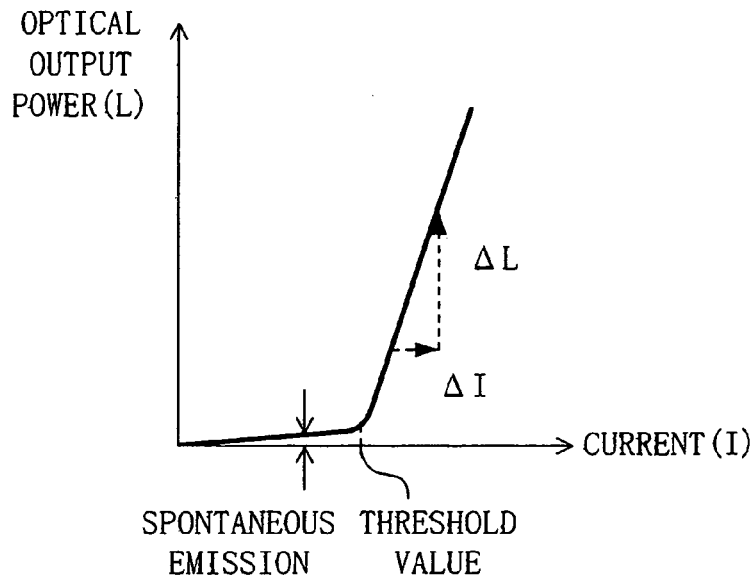
FIG. 16(a) is a graph illustrating an I-L characteristic between the operating current and optical output power in an ordinary semiconductor laser device.
Figure 16B:
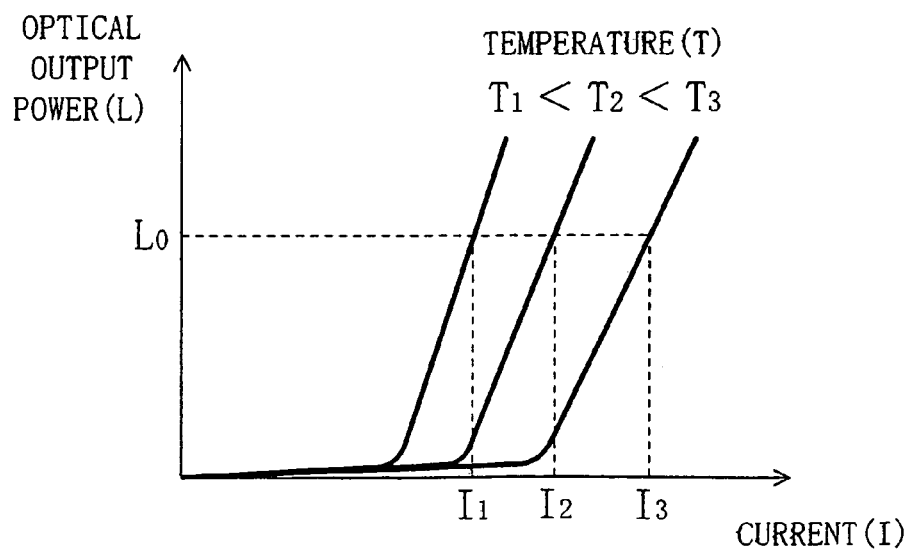
FIG. 16(b) is a graph illustrating how the I-L characteristics depend on the temperature.

FIG. 16(a) illustrates an I-L characteristic between the operating current and optical output power of a semiconductor laser device, while FIG. 16(b) illustrates how the I-L characteristics change depending on the temperature. In FIG. 16(a), a variation $\Delta L$ in optical output power against a variation $\Delta I$ in operating current is generally called "slope efficiency".

Suppose predetermined optical output power $L_0$ is attained when the temperature and operating current are equal to $T_1$ and $I_1$, respectively, as shown in FIG. 16(b). In such a case, to maintain the optical output power at $L_0$, the operating current should be equal to $I_2$ and $I_3$ at second and third temperatures $T_2$ and $T_3$, respectively, where $I1<I2<I3$ and $T1<T2<T3$.

The slope efficiency differs greatly among individual laser devices, and therefore is very sensitive to the temperature. Specifically, as the temperature rises, the threshold current tends to increase and the slope efficiency tends to decrease as shown in FIG. 16(b). Accordingly, the higher the temperature, the larger the operating current should be to attain predetermined optical output power.

Thus, in applying a semiconductor laser device with such temperature dependence to an actual product, the operating current thereof should be regulated based on the temperature of the laser device to maintain the predetermined optical output power $L_0$. Alternatively, the temperature of the laser device should be kept at a predetermined value.

An automatic power control technique for regulating the operating current of a semiconductor laser device by detecting part of laser radiation at a photoelectric transducer and monitoring the optical output power is usually adopted as an alternative method for maintaining the optical output power without depending on the temperature. To monitor the optical output power as required by the automatic power control, the outgoing radiation emitted from a semiconductor laser device should be received at a photoelectric transducer such as a photodiode. In general, laser radiation emits from both end facets of a resonant cavity mirror of a semiconductor laser device. Accordingly, the radiation emitted forward from one of these facets (hereinafter, referred to as "forward radiation") is ordinarily allowed to go out of a package, while the radiation emitted backward from the other facet (hereinafter, referred to as "backward radiation") is usually received at a photodiode within the package.

In this case, non-directional spontaneous emission is radiated from the active region of the semiconductor laser device toward surrounding regions before the current reaches a threshold value where laser oscillation starts. A component of the spontaneous emission that has been radiated through the resonant cavity mirror of the semiconductor laser device is represented in the I-L characteristic curve shown in FIG. 16(a) as optical output before the current applied reaches its threshold value.

Next, it will be described how the I-L characteristic varies with the material of the semiconductor laser device, i.e., depending on the oscillation wavelength.

FIG. 17 illustrates, in comparison, respective I-L characteristics of InGaAlP and InGaAlN semiconductor laser devices with mutually different oscillation wavelengths. In FIG. 17, the curve 5 represents the I-L characteristic of the InGaAlP semiconductor laser device that is formed on a GaAs substrate and oscillates at a wavelength of about 650 nm. On the other hand, the curve 6 represents the I-L characteristic of the InGaAlN semiconductor laser device that is formed on a sapphire substrate and oscillates at a wavelength of about 400 nm. As can be seen from FIG. 17, the quantity of spontaneous emission radiated from the InGaAlN semiconductor laser device at a threshold value (curve 6) is more than five times as large as that radiated from the InGaAlP semiconductor-laser device at the threshold-value (curve 5). The reason is believed to be as follows. Since the GaAs substrate absorbs light at wavelengths of 870 nm or less, the spontaneous emission that has been radiated from the InGaAlP semiconductor laser device at the wavelength of 650 nm is absorbed into the GaAs substrate. In contrast, the sapphire substrate cannot absorb the spontaneous emission that has been radiated from the InGaAlN semiconductor laser device at the wavelength of 400 nm.

If a large quantity of spontaneous emission is radiated in this manner before the current reaches its threshold value of oscillation, then the spontaneous emission is unintentionally input as bias light to the monitoring photodiode. Thus, the optical output power cannot be controlled precisely even by the automatic power control technique.

Next, a package for a semiconductor laser device (hereinafter, simply referred to as a "semiconductor laser package") according to the seventh embodiment of the present invention will be described with reference to FIG. 14.

Figure 14:
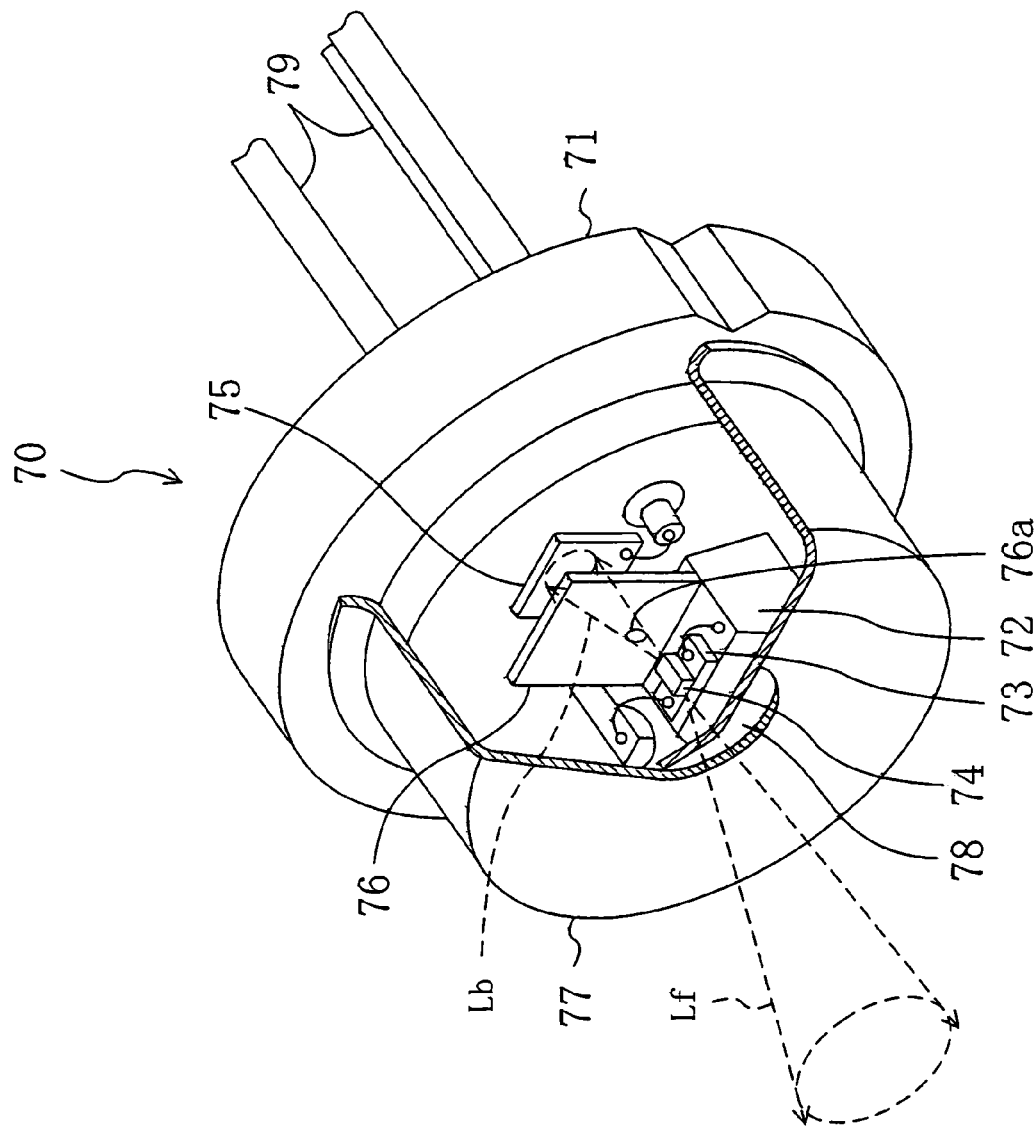
FIG. 14 is a perspective view partly in section illustrating a semiconductor laser device according to a seventh embodiment of the present invention.

FIG. 14 is a perspective view partly in section illustrating a semiconductor laser package 70 according to the seventh embodiment. As shown in FIG. 14, the semiconductor laser package according to the seventh embodiment includes: a disklike base 71; a parallelepiped mount 72; a submount 73; and a semiconductor laser chip 74. The base 71 and the mount 72 are both made of a metal with excellent heat dissipation properties. A side face of the mount 72 is secured to the upper surface of the base 71 such that the upper bottom of the mount 72 is parallel to the axis of the base 71. The semiconductor laser chip 74 is bonded to the upper bottom of the mount 72 with the submount 73 interposed therebetween such that the optical axis of the laser radiation emitted therefrom is substantially parallel to the axis of the base 71.

A photodiode 75, which function as a photoelectric transducer for detecting the backward radiation Lb emitted from the semiconductor laser chip 74, is secured onto a region of the base 71 that faces the semiconductor laser chip 74.

In addition, a light-blocking plate 76 with an opening 76a is further provided between the semiconductor laser chip 74 located over the upper bottom of the mount 72 and the photodiode 75 such that the optical axis of the backward radiation Lb passes through the opening 76a. The light-blocking plate 76 may be made of any material not transmitting the laser radiation, e.g., metal, plastic or glass. At least a surface of the light-blocking plate 76 that faces the semiconductor laser chip 74 is preferably mat such that of the backward radiation Lb is not reflected from the surface of the plate 76 and combine with the forward radiation Lf. Furthermore, the light-blocking plate 76 is preferably made of a material absorbing the laser radiation or at least the surface of the plate 76 facing the laser chip 74 should be coated with a paint, for example, which absorbs the laser radiation.

A cap 77 is secured airtight onto the upper surface of the base 71 so as to cover the mount 72 and the light-blocking plate 76 entirely. A window that can transmit the forward radiation Lf is provided for the cap 77 such that the optical axis of the forward radiation Lf passes therethrough. And the window is hermetically sealed with window glass 78. Also, outer leads 79 for electrically connecting the semiconductor laser chip 74 and the photodiode 75 to external components are provided on the lower surface of the base 71.

Laser radiation shows intense directivity and is emitted along the optical axis thereof while expanding at a certain angle. In contrast, spontaneous emission is radiated from the semiconductor laser chip 74 toward the regions surrounding the chip 74 in all the directions. Thus, it is usually difficult to separate a component of the spontaneous emission that has been emitted in the direction of the optical axis of the laser radiation from the laser radiation itself. However, according to this embodiment, the light-blocking plate 76 with the opening 76a is provided between the semiconductor laser chip 74 and the photodiode 75 so as to allow the optical axis of the laser radiation to pass therethrough. In such a case, nothing but that component of the spontaneous emission in the direction of the optical axis of the laser radiation is detected by the photodiode 75.

As described above, in an InGaAlN laser device, which oscillates at a wavelength of about 400 nm and includes sapphire, SiC or GaN substrate for the semiconductor laser chip 74, the substrate does not absorb the spontaneous emission. Thus, a larger quantity of spontaneous emission leaks out of the semiconductor laser chip 74 compared to a red-light-emitting laser device with an oscillation wavelength of about 650 nm. Accordingly, remarkable effects are attainable if the light-blocking plate 76 is provided between the semiconductor laser chip 74 and the monitoring photodiode 75 so as to attenuate the spontaneous emission passing through the plate 76 to a larger degree than the backward radiation Lb passing through the plate 76 as is done in this embodiment.

The larger the size of the opening 76a, the lesser the degrees of attenuation of the backward radiation Lb and spontaneous emission. Accordingly, the size should be set at an appropriate value such that the backward radiation Lb attenuates to a lesser degree and that the spontaneous emission attenuates to a larger degree. More preferably, the size should be set at such a value as substantially eliminating the attenuation of the backward radiation Lb.

The shape of the opening 76a of the light-blocking plate 76 may be either circular or square. Specifically, the opening 76a is preferably oval so as to correspond to an ordinary beam spot shape of the laser radiation emitted from the semiconductor laser chip. However, the beam spot shape of the backward radiation might sometimes be irregular depending on how the semiconductor laser chip has been mounted. Thus, the oval opening is not always an optimum one.

Figure 15:
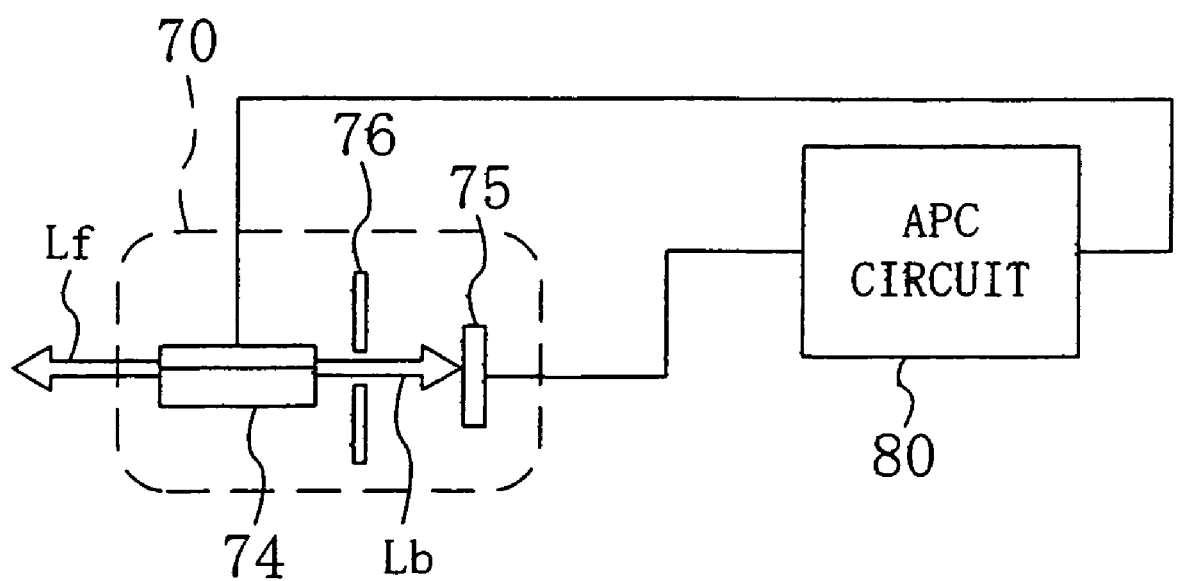
FIG. 15 schematically illustrates how to perform automatic power control on the semiconductor laser device according to the seventh embodiment.

FIG. 15 schematically illustrates how to perform automatic power control on the semiconductor laser package according to the seventh embodiment. In FIG. 15, the same components as those illustrated in FIG. 14 are identified by the same reference numerals. As shown in FIG. 15, the backward radiation Lb that has been emitted from the semiconductor laser chip 74 is photoelectrically converted by the photodiode 75 into an electrical signal, which is then output as a monitor signal to an APC circuit 80. In response to the monitor signal, the APC circuit 80 regulates the operating current of the semiconductor laser chip 74 such that the optical output power of the semiconductor laser chip 74 is kept at a predetermined value.

According to the seventh embodiment, all of the spontaneous emission radiated from the semiconductor laser chip 74, except for its component emitted in the same direction as the backward radiation Lb of the laser radiation, is blocked by the light-blocking plate 76 provided between the semiconductor laser chip 74 and the photodiode 75, and is not incident on the photodiode 75. Thus, the quantity of the spontaneous emission detected can be reduced to about one-tenth compared to a situation where the light-blocking plate 76 is not provided. As a result, the adverse effects of the spontaneous emission can also be reduced even while the optical output power is still low, i.e., the operating current is close to its threshold value, thus improving the precision of the automatic power control.

In the prior art, the photodiode 75 unintentionally converts photoelectrically not only the backward radiation Lb detected but also that component of the spontaneous emission that has been combined with the backward radiation Lb in a relatively large quantity. Thus, the photodiode 75 estimates erroneously the optical output power of the laser chip higher than the actual one. As a result, the APC circuit 80 selects operating current corresponding to optical output power lower than the predetermined one.

In the foregoing embodiment, the light-blocking plate 76 with the opening 76a is used as an exemplary light-blocking means. However, the opening 76a does not always have to be provided. For example, the light-blocking plate 76 may be replaced with a thin film that attenuates the spontaneous emission to a larger degree than the laser radiation.

Also, the light-blocking means need not be a plate but may be a cylindrical member extending in such a direction as allowing the optical axis of the backward radiation Lb to pass therethrough.

Furthermore, the light-blocking means is not limited to a member provided between the semiconductor laser chip 74 and the photodiode 75. For example, the light-blocking means may also be a gaseous or resin encapsulant that fills the inside of the cap 77 shown in FIG. 14 and that attenuates the spontaneous emission to a larger degree than the laser radiation.

It is naturally possible to reduce the spontaneous emission by providing a similar light-blocking plate 76 to the exemplified one for an InGaAlP laser device of a long-wave-oscillating type, although the effects attained are not so significant compared to the situation described above.

What is claimed is:

1. A semiconductor laser device comprising:
   a first cladding layer, which is made of a nitride semiconductor of a first conductivity type and is formed over a substrate;
   an active layer, which is made of another nitride semiconductor and is formed over the first cladding layer;
   a second cladding layer, which is made of still another nitride semiconductor of a second conductivity type and is formed over the active layer; and
   an electrode, which is formed over the second cladding layer and injects striped current into the active layer,
   wherein a recess is formed in the active layer beside and along a region of the active layer to which the striped current is injected, and
   wherein the recess is filled in with a spontaneous-emission-absorbing member for absorbing spontaneous emission that has been radiated from the active layer.

2. The device of claim 1, wherein the spontaneous-emission-absorbing member is made of silicon or a metal containing gold.

3. An optical disk apparatus comprising:

a semiconductor laser device;

a condensing optical system for condensing laser radiation that has been emitted from the semiconductor laser device on a storage medium on which data has been recorded; and a photodetector for detecting the laser radiation that has been reflected from the storage medium, wherein the semiconductor laser device comprises:

a first cladding layer, which is made of a nitride semiconductor of a first conductivity type and is formed over a substrate;

an active layer, which is made of another nitride semiconductor and is formed over the first cladding layer;

a second cladding layer, which is made of still another nitride semiconductor of a second conductivity type and is formed over the active layer; and an electrode, which is formed over the second cladding layer and injects striped current into the active layer, wherein a recess is formed in the active layer beside and along a region of the active layer to which the striped current is injected, and wherein the recess is filled in with a spontaneous-emission-absorbing member for absorbing spontaneous emission that has been radiated from the active layer.

4. An optical integrated unit comprising:

a semiconductor laser device mounted on a support member made of a semiconductor; and a photodetector, which is formed on the support member and detects a reflected part of laser radiation that has been emitted from the semiconductor laser device, wherein the semiconductor laser device comprises:

a first cladding layer, which is made of a nitride semiconductor of a first conductivity type and is formed over a substrate;

an active layer, which is made of another nitride semiconductor and is formed over the first cladding layer;

a second cladding layer, which is made of still another nitride semiconductor of a second conductivity type and is formed over the active layer; and an electrode, which is formed over the second cladding layer and injects striped current into the active layer, wherein a recess is formed in the active layer beside and along a region of the active layer to which the striped current is injected, and wherein the recess is filled in with a spontaneous-emission-absorbing member for absorbing spontaneous emission that has been radiated from the active layer.

* * * * *